(12) United States Patent
Kitazaki

(10) Patent No.: US 7,983,067 B2
(45) Date of Patent: Jul. 19, 2011

(54) SEMICONDUCTOR MEMORY DEVICE WITH FERROELECTRIC MEMORY

(75) Inventor: Soichirou Kitazaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 12/543,048

(22) Filed: Aug. 18, 2009

(65) Prior Publication Data

US 2010/0039850 A1 Feb. 18, 2010

(30) Foreign Application Priority Data

Aug. 18, 2008 (JP) ................. 2008-209980

(51) Int. Cl.
G11C 11/22 (2006.01)
G11C 11/24 (2006.01)
G11C 21/00 (2006.01)
(52) U.S. Cl. ...... 365/145; 365/149; 438/3; 257/E21.001
(58) Field of Classification Search .......... None
See application file for complete search history.

(56) References Cited

U.S. PATENT DOCUMENTS 6,141,238 A * 10/2000 Forbes et al. ................. 365/145
6,191,441 B1 2/2001 Aoki et al.

FOREIGN PATENT DOCUMENTS

JP 11-204747 7/1999
JP 2007-042164 2/2007

* cited by examiner

*Primary Examiner* — Hoai V Ho
*Assistant Examiner* — James G Norman
(74) *Attorney, Agent, or Firm* — Oblon, Spivak, McClelland, Maier & Neustadt, L.L.P.

(57) ABSTRACT

A semiconductor memory device includes plural word lines, plural first bit lines, plural plate lines formed corresponding to the word lines, plural second bit lines formed corresponding to the first bit lines, plural first ferroelectric capacitors each including a ferroelectric film between two electrodes, plural cell transistor formed corresponding to the first ferroelectric capacitors, and including a gate coupled to the word lines, plural second ferroelectric capacitors each including a ferroelectric film between two electrodes, and a sense amplifier configured to detect data stored in the first ferroelectric capacitors through the first bit lines or data stored in the second ferroelectric capacitors through the second bit line, or to write data in the first ferroelectric capacitors or the second ferroelectric capacitors. The first ferroelectric capacitors and the cell transistors connect between the first bit lines and the plate lines in series, and the second ferroelectric capacitors connect between the second bit lines and the word lines.

11 Claims, 21 Drawing Sheets

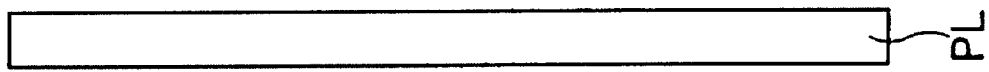
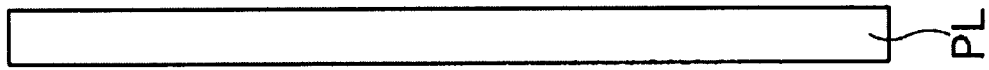
Fig. 11

SEMICONDUCTOR MEMORY DEVICE WITH FERROELECTRIC MEMORY

CROSS-REFERENCE TO RELATED APPLICATIONS

This application is based upon and claims the benefit of priority from the prior Japanese Patent Application No. 2008-209980, filed Aug. 18, 2008, the entire contents of which are incorporated herein by reference.

BACKGROUND OF THE INVENTION

1. Field of the Invention

This invention relates to a ferroelectric memory with respect to a semiconductor memory device.

2. Description of the Related Art

A background ferroelectric memory includes two or more memory cells which have a ferroelectric capacitor and a selection transistor. Each memory cell is provided at a respective intersection of a word line and a bit line. Each memory cell includes one ferroelectric capacitor, and the ferroelectric capacitor stores logical data.

In recent years, miniaturization of a memory chip and high-density of data are increasingly desired. However, in the background ferroelectric memory, each memory cell can store only 1 bit data, unless a ferroelectric capacitor stores multi-value data.

SUMMARY OF THE INVENTION

A semiconductor memory device according to an exemplary aspect of the present invention includes: a plurality of word lines, a plurality of first bit lines, a plurality of plate lines formed corresponding to the word lines, a plurality of second bit lines formed corresponding to the first bit lines, a plurality of first ferroelectric capacitors each including a ferroelectric film between two electrodes, a plurality of cell transistors formed corresponding to the first ferroelectric capacitors, and each including a gate coupled to a respective word line, a plurality of second ferroelectric capacitors each including a ferroelectric film between two electrodes, and sense amplifiers configured to detect data stored in the first ferroelectric capacitors through the first bit lines or data stored in the second ferroelectric capacitors through the second bit lines, or write data into the first ferroelectric capacitors or the second ferroelectric capacitors, wherein a respective of the first ferroelectric capacitors and the cell transistors connect between a respective first bit line and plate line in series, and a respective of the second ferroelectric capacitors connects between a respective second bit line and word line.

A manufacturing method of a semiconductor memory device according to an exemplary aspect of the present invention includes: forming a plurality of plate lines in a substrate, forming a plurality of first ferroelectric capacitors in the substrate so that the first ferroelectric capacitors connect to the plate lines, the first ferroelectric capacitors each including a first ferroelectric film between a first upper electrode and a first lower electrode, forming a plurality of cell transistors on the substrate, each cell transistor including a source region connected to the first upper electrode, a drain region, and a gate electrode including a word line, forming a plurality of second ferroelectric capacitors on the cell transistor, each second ferroelectric capacitor including a second ferroelectric film between a second upper electrode and a second lower electrode connected to the gate electrode through a gate contact, forming a plurality of first bit lines each coupled to a respective drain of a cell transistor through a first bit line contact, and forming a plurality of second bit lines each coupled to a respective second upper electrode through a second bit line contact.

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings, wherein:

FIG. 11 is a plane view showing a method for manufacturing the ferroelectric memory according to the 1st embodiment;

DETAILED DESCRIPTION OF THE PREFERRED EMBODIMENTS

Figure 1:
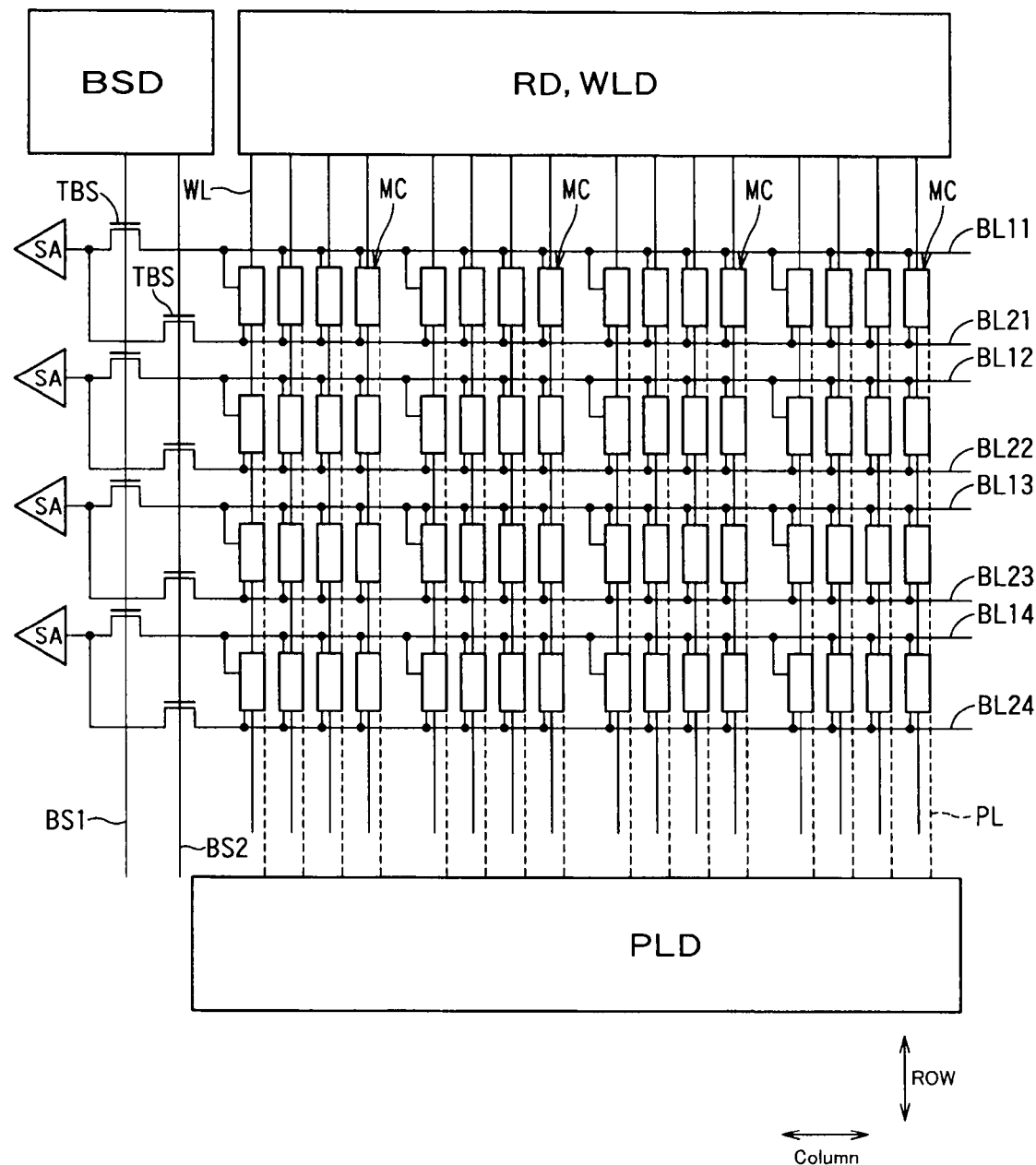
FIG. 1 is a block diagram of a ferroelectric memory according to a first embodiment of the present invention.

Various objects, features and attendant advantages of the present invention will be more fully appreciated from the following detailed description when considered in connection with the accompanying drawings in which like reference characters designate like or corresponding parts throughout the several views.

FIG. 1 is a block diagram of the ferroelectric memory according to an exemplary first embodiment of the invention. The ferroelectric memory includes a plurality of word lines WL arranged in a row direction, a plurality of 1st bit lines BL1$j$ (j is an integer) arranged in a column direction which intersect perpendicularly to the row direction, a plurality of 2nd bit lines BL2$j$ arranged in the column direction corresponding to 1st bit lines BL1$j$, and a plurality of plate lines PL arranged in the row direction corresponding to the word lines WL. In addition, in FIG. 1, plate lines PL are shown by a dashed line, to distinguish the plate lines PL from the word lines WL.

In FIG. 1, a cell block (CB) including a plurality of memory cells MC is arranged in a matrix of 16×4 in a plane. However, the number of memory cells MC is not limited to the matrix of 16×4. One memory cell MC includes two ferroelectric capacitors, and each ferroelectric capacitor stores binary data or multi-bit data as mentioned in the following.

Each memory cell MC is formed on the semiconductor substrate. Each memory cell MC is formed corresponding to the intersection between a word line WL and a 1st or 2nd bit line BL$ij$ (i=1 or 2). Each word line WL is formed corresponding to the respective memory cell MC arranged in the row direction. Each bit line BL$ij$ is formed corresponding to the respective memory cell MC arranged in the column direction. Each plate line PL is formed corresponding to the respective memory cell MC arranged in the row direction.

Word line drive circuit WLD is connected to the word lines WL. Word line drive circuit WLD chooses one of word lines WL according to an address received from a row decoder RD, and activates the selected word line WL.

Here, activation means making an element or a circuit turn on or drive, and inactivation means turning off or stopping the element or the circuit. Therefore, there exist two cases that a signal of HIGH (high potential level) maybe an activation signal and a signal of LOW (low potential level) may be an activation signal. For example, an NMOS transistor is activated by setting a gate to HIGH. On the other hand, a PMOS transistor is activated by setting a gate to LOW.

Sense amplifiers SA are connected to the 1st and 2nd bit lines BL1$j$ and BL2$j$. Each sense amplifier SA detects the data from a memory cell MC transmitted to respective of the 1st or 2nd bit lines BL1$j$ or BL2$j$ at the time of data readout. Moreover, each sense amplifier SA applies a voltage to respective of the 1st and 2nd bit lines BL1$j$ and BL2$j$ at the time of data writing. Sense amplifiers SA can read data from selected memory cells MC connected to the selected word line, or can write data in the selected memory cell MC.

Plate line drive circuit PLD is connected to plate lines PL. Plate line drive circuit PLD drives plate lines PL corresponding to a selected word line according to an address received from the row decoder RD. In addition, row decoder RD may be formed in common with word line drive circuit WLD and plate line drive circuit PLD.

In a data detecting operation or a data write operation, bit select line drive circuit BSD drives either side of bit select lines BS1 or BS2 to connect either the 1st bit line BL1$j$ or 2nd bit line BL2$j$ to a sense amplifier SA.

Figure 2:
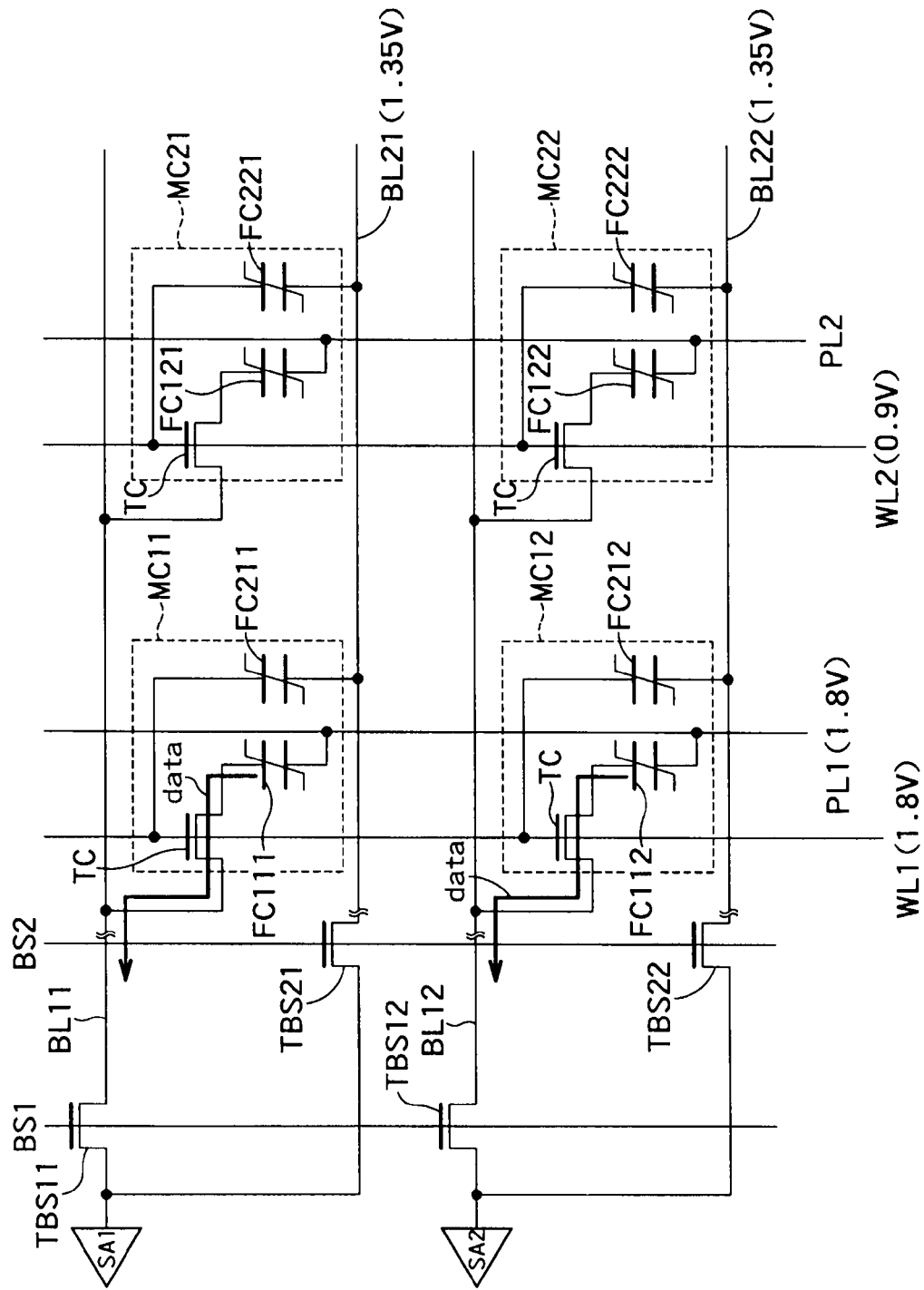
FIG. 2 is a circuit diagram showing the configuration and data readout operation of memory cell MC according to the first embodiment.

FIG. 2 is a circuit diagram and shows a data readout operation of selected memory cells MC according to this embodiment. FIG. 2 shows memory cells MC11-MC22 of 2×2 from memory cells MC shown in FIG. 1.

Memory cells MC11-MC22 are formed corresponding to the intersection of 1st bit lines BL11 and BL12 and word lines WL1 and WL2, respectively. 2nd bit lines BL21 and BL22 are formed corresponding to 1st bit lines BL11 and BL12, respectively, and are arranged in a column direction. 1st bit line BL11 and 2nd bit line BL21 are one bit line pair, and 1st bit line BL12 and 2nd bit line BL22 are one bit line pair.

Sense amplifier SA1 is formed corresponding to bit line pairs BL11 and BL21, and sense amplifier SA2 is formed corresponding to bit line pairs BL12 and BL22. Sense amplifier SA1 is connected to bit lines BL11 and BL21 through firs/second bit line select transistors TBS11 and TBS21. Sense amplifier SA2 is connected to bit lines BL12 and BL22 through firs/second bit line select transistors TBS12 and TBS22.

Memory cells MC11 and MC21 are connected to bit line pairs BL11 and BL21. Memory cells MC12 and MC22 are connected to bit line pairs BL12 and BL22.

Each of memory cells MC11-MC22 include respective of 1st ferroelectric capacitors FC111, FC121, FC112 and FC122, respective of 2nd ferroelectric capacitors FC211, FC221, FC212 and FC222, and a cell transistor TC.

1st ferroelectric capacitors FC1$ij$ include a ferroelectric film between two electrodes, and can store logical data with polarization characteristics of a ferroelectric film. 2nd ferroelectric capacitors FC2$ij$ include a ferroelectric film between two electrodes like 1st ferroelectric capacitors FC1$ii$, respectively, and store logical data with polarization characteristics of a ferroelectric film. 1st ferroelectric capacitors FC1$ij$ and 2nd ferroelectric capacitors FC2$ij$ may have the same structure. 1st ferroelectric capacitors FC1$ij$ and 2nd ferroelectric capacitors FC2$ij$ may alternatively have a different structure.

Cell transistors TC are formed corresponding to the 1st and 2nd ferroelectric capacitors FC111-FC222. The gates of cell transistors TC are connected to word lines WL1 or WL2. 1st ferroelectric capacitors FC1$ij$ and respective of cell transistors TC are connected in series between 1st bit lines BL1$j$ and plate lines PL1 or PL2. For memory cells MC11 MC21 the ends of the cell transistors TC are connected to 1st bit line BL11. In detail, the 1st ferroelectric capacitors FC1$ij$ are connected between the other ends of cell transistors TC and plate lines PL1 or PL2, and the 2nd ferroelectric capacitors FC2$ij$ are connected between word lines WL1 or WL2 and 2nd bit line BL21.

Sense amplifier SA1 detects the data stored in 1st ferroelectric capacitors FC111 or FC121, or writes data into 1st ferroelectric capacitors FC111 or FC121, through 1st bit line BL11 and first bit line select transistor TBS11. Sense amplifier SA1 detects the data stored in 2nd ferroelectric capacitors FC211 or FC221, or writes data into 2nd ferroelectric capacitors FC211 or FC221, through the 2nd bit line BL21 and second bit line select transistor TBS21.

Sense amplifier SA2 detects the data stored in 1st ferroelectric capacitors FC112 or FC122, or writes data into 1st ferroelectric capacitors FC112 or FC122, through 1st bit line BL12 and first bit line select transistor TBS12. Sense amplifier SA2 detects the data stored in 2nd ferroelectric capacitors FC212 or FC222, or writes data into 2nd ferroelectric capacitors FC212 or FC222, through 2nd bit line BL22 and second bit line select transistor TBS22.

In a data detecting operation a sense amplifier SA detects the data which is stored in a respective memory cell. The data detected by sense amplifier SA may be read to an external point of a memory chip through a buffer and an I/O circuit (not illustrated). Since a readout operation to the external point of a memory from sense amplifier SA may be the same as in a conventional device, only a detecting operation by the sense amplifier is explained here. Hereafter, the detecting operation by the sense amplifier SA is also called a "readout operation".

In a detecting operation shown in FIG. 2, it is assumed that WL1 is a selected word line and the data of memory cells MC11 and MC12 is detected. Since the detecting operation of the data of memory cells MC21 and MC22 can be easily understood from the detecting operation of the data of memory cells MC11 and MC12, that explanation is omitted.

[Data Detecting Operation of 1st Ferroelectric Capacitors]

FIG. 2 shows a data detecting operation of 1st ferroelectric capacitors FC111 and FC112. 1st bit lines BL1$j$ are preliminarily precharged at 0V or a middle potential of data "0" and data "1" (for example, 0.9V) before detection of a signal.

In the data detecting operation of the 1st ferroelectric capacitor, the potential of selected word line WL1 is set to high potential VWLH (for example, 1.8V), and the potential of non-selected word line WL2 is set to low level potential VWLL (for example, 0.9V).

Here, potential VWLH is higher than a threshold voltage of the cell transistors TC in memory cells MC11 and MC12, and the cell transistor TC is turned on by the potential. Potential VWLL is lower than the threshold voltage of cell transistors TC, and cell transistors TC are not turned on by the potential. Thereby, 1st ferroelectric capacitors FC111 and FC112 in selected memory cells MC11 and MC12 are conducted to the 1st bit lines BL11 and BL12, respectively.

Bit select line BS1 is activated and first bit line select transistors TBS11 and TBS12 are turned on. Bit select line BS2 is still in an inactive state, and second bit line select transistors TBS21 and TBS22 are not turned on.

The potential of plate line PL1 is set to high potential (for example, 1.8V). Thereby, the data of 1st ferroelectric capacitors FC111 and FC112 is transmitted to 1st bit lines BL11 and BL12, respectively. Sense amplifiers SA1 and SA2 receive the data through 1st bit lines BL11 and BL12, respectively, compare the data with standard data, and detect the data.

At this time, the potential of 2nd bit lines BL21 and BL22 may be a middle potential (for example, 1.35V) between potential VWLH of selected word line WL1 and potential VWLL of non-selected word line WL2 so that the data stored in the 2nd ferroelectric capacitors FC2$ij$ does not come under the influence of a disturbance. The reason is as follows.

The two 2nd ferroelectric capacitors FC211 and FC221 in memory cells MC11 and MC21 are connected in series through 2nd bit line BL21 between selected word line WL1 and non-selected word line WL2. Therefore, a voltage which is applied to the 2nd ferroelectric capacitors FC211 and FC221 becomes a half of a potential difference of potential VWLH and potential VWLL (½ (VWLH+VWLL)) by setting the potential of 2nd bit line BL21 to a middle potential of potential VWLH and potential VWLL. This can suppress a disturbance of the data stored in 2nd ferroelectric capacitors FC211 and FC221. 2nd ferroelectric capacitors FC212 and FC222 in memory cells MC12 and MC22 operate the same as above.

Here, the potential ½ (VWLH+VWLL) needs to be small enough so that a disturbance does not influence the data stored in 2nd ferroelectric capacitors FC2$ij$. This is because there is a possibility that a disturbance will occur to the data of 2nd ferroelectric capacitors FC2$ij$ when the potential difference of VWLH and VWLL is too large. That is, in the viewpoint of a disturbance against the data of 2nd ferroelectric capacitors FC2$ij$, it is desirable for the potential difference of VWLH and VWLL to be smaller. Thereby, a disturbance of the data of 2nd ferroelectric capacitors FC2$ij$ can be suppressed, making cell transistors TC of non-selected memory cells MC21 and MC22 into an OFF state.

A potential of plate line PL2 may be floating, or may be set to an arbitrary potential. This is because memory cells MC21 and MC22 are not conducted to 1st bit lines BL11 and BL12. To make control of a plate potential easier, the potential of plate line PL2 may be the same as the potential (for example, 1.8V) of plate line PL1.

[Data Detecting Operation of 2nd Ferroelectric Capacitors]

Figure 3:
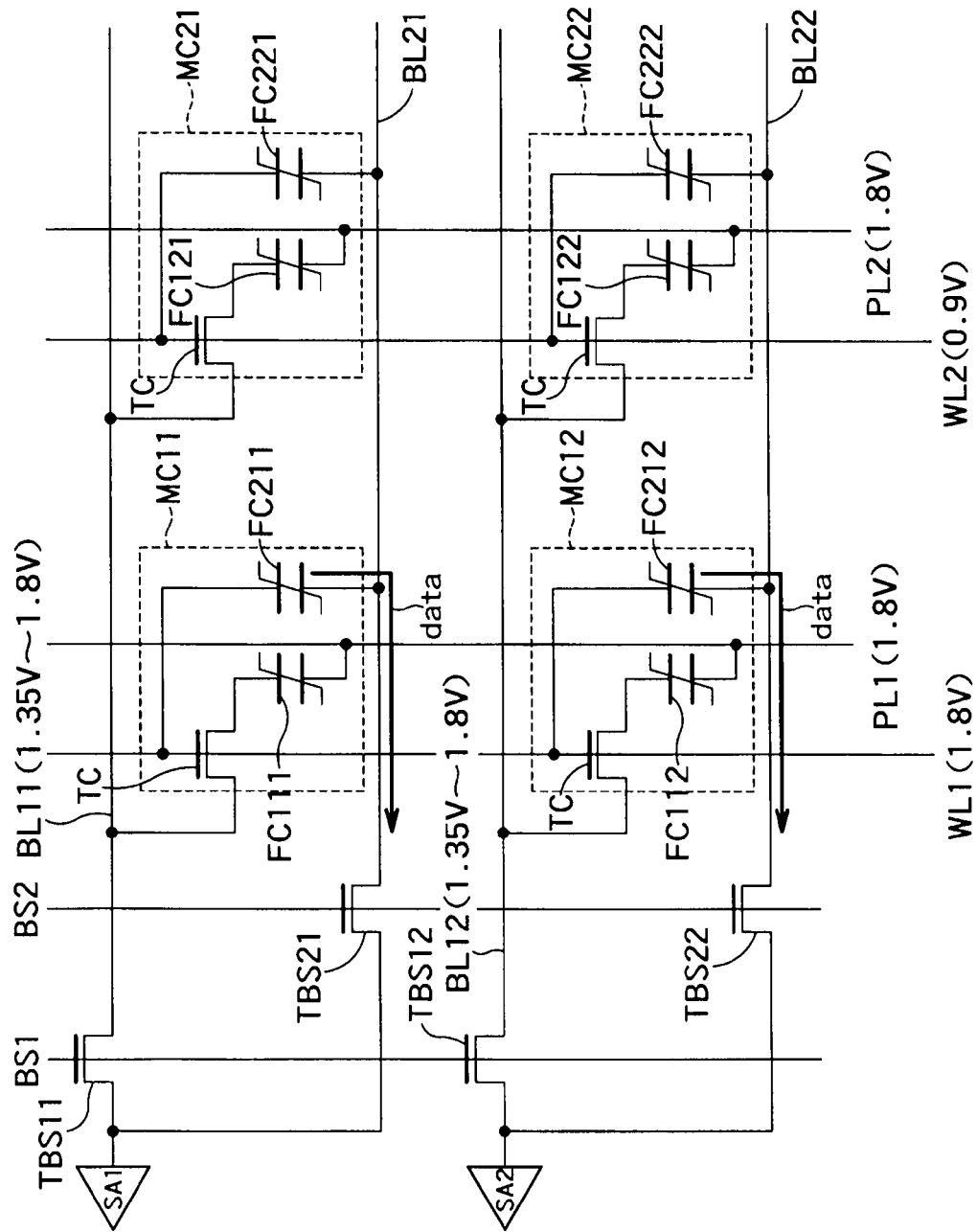
FIG. 3 is a circuit diagram showing a data detecting operation of 2nd ferroelectric capacitors FC211 and FC212.

FIG. 3 shows a data detecting operation of 2nd ferroelectric capacitors FC211 and FC212. In the data detecting operation of the 2nd ferroelectric capacitors, a potential of the selected word line WL1 is set to high potential VWLH (for example, 1.8V), and a potential of non-selected word line WL2 is set to low level potential VWLL (for example, 0.9V). 2nd bit lines BL2$j$ are preliminarily precharged at 0V or a middle potential (for example, 0.9V) of data "0" and data "1" before detection of a signal.

It is desirable that a potential of non-selected word line WL2 has almost the middle potential between a potential of the 2nd bit line which transmits data "0" and a potential of the 2nd bit line which transmits data "1" so that 2nd ferroelectric capacitors FC221 and FC222 connected to non-selected word line WL2 do not come under the influence of a disturbance. The reason is as follows.

2nd ferroelectric capacitors FC221 and FC222 are connected in series through non-selected word line WL2 between 2nd bit lines BL21 and BL22. Therefore, a voltage applied to 2nd ferroelectric capacitors FC221 and FC222 becomes a half of a potential difference between the bit line transmitting data "0" and the bit line transmitting data "1" by setting a potential of the non-selected word line WL2 to the middle potential of data "1" and data "0".

A disturbance against the data of 2nd ferroelectric capacitors FC221 and FC222 can be suppressed, changing word line WL2 into a non-selected state and making cell transistors TC of memory cells MC21 and MC22 into an OFF state.

Bit select line BS2 is activated and second bit line select transistors TBS21 and TBS22 are turned on. Thereby, sense amplifiers SA1 and SA2 are connected to 2nd bit lines BL21 and BL22, respectively. Bit select line BS1 is still in an inactive state, and first bit line select transistors TBS11 and TBS12 are not turned on.

The data of 2nd ferroelectric capacitors FC211 and FC212 in selected memory cells MC11 and MC12 are transmitted to sense amplifiers SA1 and SA2 through 2nd bit lines BL21 and BL22, respectively. Sense amplifiers SA1 and SA2 compare the data of ferroelectric capacitors FC211 and FC212 and standard data, respectively, and detect the data.

A potential of plate line PL1 corresponding to selected word line WL1 is set to the high potential (for example, 1.8V). However, since first bit line select transistor TBS11 is not turned on, the data of 1st ferroelectric capacitors FC111 and FC112 are not transmitted to 1st bit lines BL11 and BL12.

At this time, it is desirable that the potential of 1st bit lines BL11 and BL12 is a middle potential between a potential of plate line PL1 and a potential of plate line PL2 so that the data stored in 1st ferroelectric capacitor FC1$ij$ does not come under the influence of a disturbance. For example, when the potential of plate line PL2 is the same as that of plate line PL1, namely 1.8V, the potential of 1st bit lines BL11 and BL12 is 1.8V. When the potential of plate line PL2 is 0.9V, the potential of 1st bit lines BL11 and BL12 is 1.35V. In addition, non-selected plate line PL2 may be floating. In this case, the potential of bit line BL11 may be equal to the potential of plate line PL1.

1st two ferroelectric capacitors FC111 and FC121 in memory cells MC11 and MC21 are not connected to 1st bit line BL11 by cell transistor TC of memory cell MC21. However, in consideration of capacity coupling between 1st bit line BL11 and 1st ferroelectric capacitors FC111 or FC121, it is desirable that a potential of 1st bit line BL11 is a middle potential between the potential of plate line PL1 and the potential of plate line PL2. The voltage applied to each of 1st ferroelectric capacitors FC111 and FC121 is decreased, and it suppresses a disturbance to the data stored in 1st ferroelectric capacitors FC111 and FC121. By the same reason, it is desirable that a potential of 1st bit line BL21 is a middle potential between the potential of plate line PL1 and the potential of plate line PL2.

Sense amplifiers SA1 and SA2 latch the detected data temporarily. When reading out this data to an external point of a memory chip, the data is read to the external point of a memory chip through a buffer and an I/O circuit (not illustrated). With that operation, sense amplifiers SA1 and SA2 restore data to an original memory cell.

Next, a data write-in operation is explained.

[Data Write-in Operation to 1st Ferroelectric Capacitors]

Figure 4:
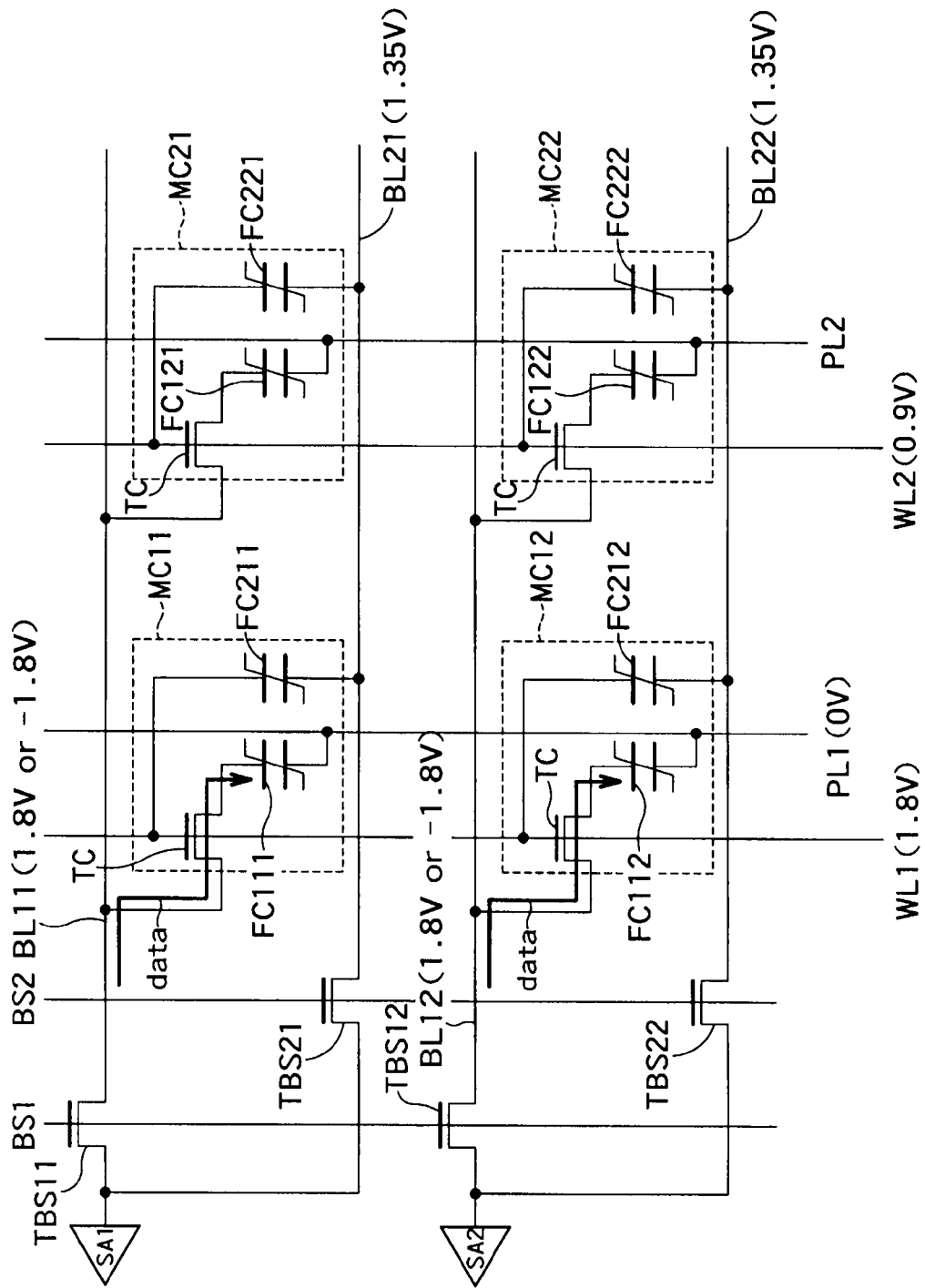
FIG. 4 is a circuit diagram showing a data write operation of 1st ferroelectric capacitors FC111 and FC112.

FIG. 4 shows a data write-in operation to 1st ferroelectric capacitors FC111 and FC112. Here, it is assumed that WL1 is a selected word line and data is simultaneously written into memory cells MC11 and MC12.

A potential of selected word line WL1 is set to high potential VWLH (for example, 1.8V), and a potential of non-selected word line WL2 is set to low level potential VWLL (for example, 0.9V). Thereby, 1st ferroelectric capacitors FC111 and FC112 in selected memory cells MC11 and MC12 are connected to 1st bit lines BL11 and BL12, respectively. On the other hand, non-selected memory cells MC21 and MC22 are not connected to 1st bit lines BL11 and BL12.

Bit select line BS1 is activated and first bit line select transistors TBS11 and TBS12 are turned on. Bit select line BS2 is still in an inactive state, and second bit line select transistors TBS21 and TBS22 are not turned on.

A potential of plate line PL1 is set to a low level potential (for example, 0V).

A potential of 1st bit lines BL11 and BL12 are set to high potential VBLH (for example, 1.8V) or low level potential VBLL (for example, −1.8V) according to write-in data.

For example, in writing data "1" into 1st ferroelectric capacitor FC111, the potential of the 1st bit line BL11 is set to VBLH. Thereby, a potential difference (for example, +1.8V) of 1st bit line BL11 and plate line PL1 is applied to 1st ferroelectric capacitor FC111. Consequently, data "1" is written into 1st ferroelectric capacitor FC111.

For example, in writing data "0" into 1st ferroelectric capacitor FC111, the potential of the 1st bit line BL11 is set to VBLL. Thereby, a potential difference (for example, −1.8V) of 1st bit line BL11 and plate line PL1 is applied to 1st ferroelectric capacitor FC111. Consequently, data "0" is written into 1st ferroelectric capacitor FC111. A polarization characteristic is realized of 1st ferroelectric capacitor FC111 that data "1" is written in with an opposite characteristics that data "0" is written in.

At this time, it is desirable that the potential of the 2nd bit lines BL21 and BL22 is a middle potential (for example, 1.35V) between potential VWLH of selected word line WL1 and potential VWLL of non-selected word line WL2 so that the data stored in 2nd ferroelectric capacitors FC2$ij$ does not come under the influence of a disturbance.

The potential of plate line PL2 may be floating, or may be set to an arbitrary potential. However, although cell transistors TC of memory cells MC21 and MC22 are not turned on, the data of 1st ferroelectric capacitors FC121 and FC122 may come under the influence of a disturbance by capacity coupling between 1st bit lines BL11 and BL12 and 1st ferroelectric capacitors FC121 and FC122. Therefore, it is more desirable that the potential of plate line PL2 is a middle potential of the potential of 1st bit lines BL11 or BL12.

[Data Write-in Operation to 2nd Ferroelectric Capacitors]

Figure 5:
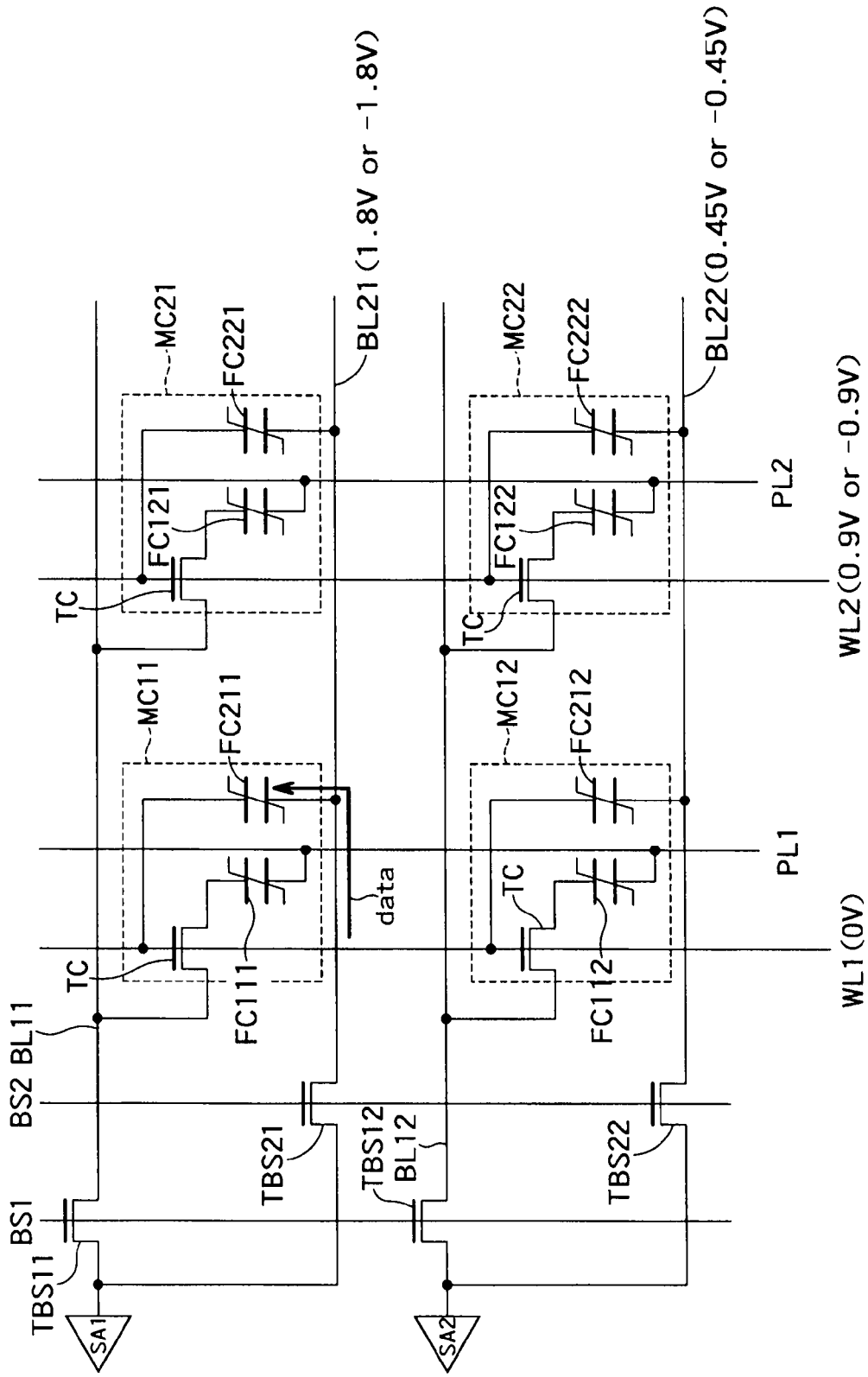
FIG. 5 is a circuit diagram showing a data write operation of a 2nd ferroelectric capacitor.
Figure 6:
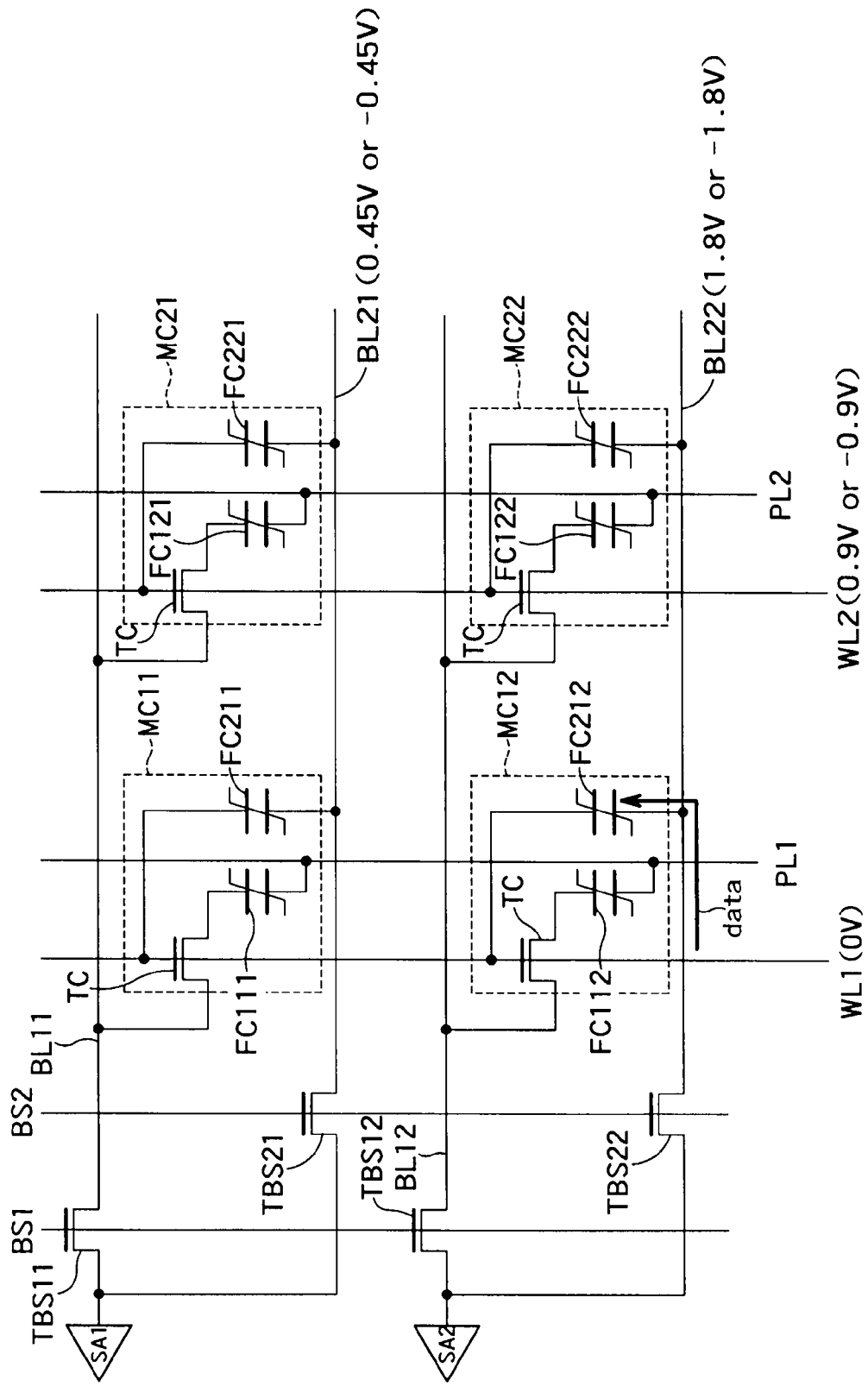
FIG. 6 is a circuit diagram showing a data write operation of a 2nd ferroelectric capacitor.

FIGS. 5 and 6 show the data writing operation to the 2nd ferroelectric capacitors FC2$ij$. The data writing to the 2nd ferroelectric capacitors FC2$ij$ is performed to every column (every bit line) in series. For example, sense amplifiers SA1 and SA2 write data into 2nd ferroelectric capacitors FC211 and FC212 by a different timing in series, respectively.

A data write-in operation to 2nd ferroelectric capacitor FC211 is explained as one example of a write into the $2^{nd}$ ferroelectric capacitors FC2$ij$. To write data into 2nd ferroelectric capacitor FC211, bit line BL21 is selected.

The potential of selected word line WL1 is mostly set to the middle potential between potential VBLH of selected bit line BL21 at the time of data "1" writing and potential VBLL of selected bit line BL21 at the time of data "0" writing. For example, when potential VBLH is set to 1.8V and potential VBLL is set to −1.8V, the potential of selected word line WL1 is set to 0V.

The potential of non-selected word line WL2 is set to the potential which will not turn on cell transistors TC of non-selected memory cells MC21 and MC22 without giving a disturbance to 2nd non-selected ferroelectric capacitors FC221 and FC222. For example, the potential of non-selected word line WL2 is the middle potential between the potential of selected bit line BL21 and the potential of selected word line WL1. In detail, when writing in data "1", the potential of 2nd bit line BL21 is set to VBLH (for example, 1.8V). Therefore, the potential of non-selected word line WL2 is set to low level potential VWLL (for example, 0.9V). When writing in data "0", the potential of 2nd bit line BL21 is set to VBLH (for example, −1.8V), and the potential of non-selected word line WL2 is set to low level potential VWLL (for example, −0.9V).

Thus, the potential of non-selected word line WL2 is changed according to the logic of the write-in data. For this reason, the writing to the 2nd ferroelectric capacitors FC2$ij$ cannot be simultaneously performed to two or more columns (two or more bit lines), but it is necessary to perform it for every column (every bit line).

Moreover, non-selected bit line BL22 is set to the middle potential between the potential of selected word line WL1 and the potential of non-selected word line WL2. Thereby, it can suppress a disturbance against the data of 2nd ferroelectric capacitors FC212 and FC222 connected to non-selected bit line BL22. For example, when the potential of selected word line WL1 is 0V and the potential of non-selected word line WL2 is 0.9V or −0.9V, the potential of non-selected bit line BL22 is driven to either 0.45V or −0.45V.

2nd ferroelectric capacitors FC212 and FC222 are connected in series through 2nd bit line BL22 between selected word line WL1 and non-selected word line WL2. Therefore, a voltage applied to 2nd ferroelectric capacitors FC212 and FC222, respectively, becomes half of the potential difference of selected word line WL1 and non-selected word line WL2 by setting the potential of 2nd bit line BL22 to a middle potential between the potential of selected word line WL1 and the potential of non-selected word line WL2. Thereby, a disturbance to the data stored in 2nd ferroelectric capacitors FC212 and FC222 is suppressed.

In the above situation, cell transistors TC of memory cells MC11-MC22 are in an OFF state. Therefore, each of the 1st ferroelectric capacitors FC1$ij$ is connected to 1st bit lines BL11 or BL12.

Bit select line BS2 is activated and second bit line select transistors TBS21 and TBS22 are turned on. When bit select line BS1 is still in an inactive state, first bit line select transistors TBS11 and TBS12 are not turned on.

In this embodiment, the data writing to the 2nd ferroelectric capacitor is performed for every column (every bit line) in series. For example, sense amplifiers SA1 and SA2 write data into 2nd ferroelectric capacitors FC211 and FC212 at different timing in series.

First, as shown in FIG. 5, when writing data "1" into 2nd ferroelectric capacitor FC211, sense amplifier SA1 sets selected bit line BL21 to VBLH (for example, 1.8V). At this time, for example, selected word line WL1 is 0V, and non-selected word line WL2 is 0.9V. Therefore, non-selected bit line BL22 is 0.45V (=0.9/2).

The potential difference applied to 2nd selected ferroelectric capacitor FC211 is 1.8V. The potential difference applied to 2nd non-selected ferroelectric capacitor FC221 is 0.9V. The potential difference applied to 2nd non-selected ferroelectric capacitors FC212 and FC222 is 0.45V. Therefore, if the potential reversed polarization state of 2nd ferroelectric capacitor FC211 to "1" is set to the range 0.9-1.8V, data "1" is written into 2nd ferroelectric capacitor FC211, and data is not written into non-selected 2nd ferroelectric capacitors FC221, FC212, and FC222.

As shown in FIG. 6, when writing data "0" into 2nd ferroelectric capacitor FC212, sense amplifier SA2 sets selected bit line BL22 to VBLL (for example, −1.8V). At this time, for example, selected word line WL1 is 0V, and non-selected word line WL2 is −0.9V. Therefore, non-selected bit line BL21 is −0.45V (=−0.9/2).

A potential difference applied to 2nd selected ferroelectric capacitor FC212 is −1.8V. A potential difference applied to 2nd non-selected ferroelectric capacitor FC222 is −0.9V, and a potential difference applied to 2nd non-selected ferroelectric capacitors FC211 and FC221 is −0.45V. Therefore, if the potential reversed polarization state of 2nd ferroelectric capacitor FC212 to "0" is set to the range −0.9-−1.8V, data "0" is written in 2nd ferroelectric capacitor FC212, and data is not written in 2nd ferroelectric capacitors FC211, FC221, and FC222.

After data is written into all memory cells MC connected to selected word line WL1, the selected word line is changed and a data write-in operation is repeated.

According to this embodiment, each memory cell MC includes respective two ferroelectric capacitors FC1$ij$ and FC2$ij$. Thereby, data can be stored with higher density than conventionally and a memory chip can be miniaturized. That is, a ferroelectric memory having large scale and small chip size can be realized. Moreover, 2nd bit line BL2$j$ is only added for control of $2^{nd}$ ferroelectric capacitor FC2$ij$. Therefore, high density growth of data and miniaturization of a memory chip are not obstructed.

In this embodiment, although the writing to the 1st ferroelectric capacitors FC1$ij$ can be performed on a block of two or more columns, the writing to the 2nd ferroelectric capacitors FC2$ij$ is performed in the every column (every bit line). That is, the writing to 2nd ferroelectric capacitors FC2$ij$ is slower than that to 1st ferroelectric capacitors FC1$ij$. Therefore, it is desirable that data is written into 1st ferroelectric capacitors FC1$ij$ first, and data is written into 2nd ferroelectric capacitor FC2$ij$ when the memory capacity of the 1st ferroelectric capacitors FC1$ij$ is not sufficient.

Figure 7:
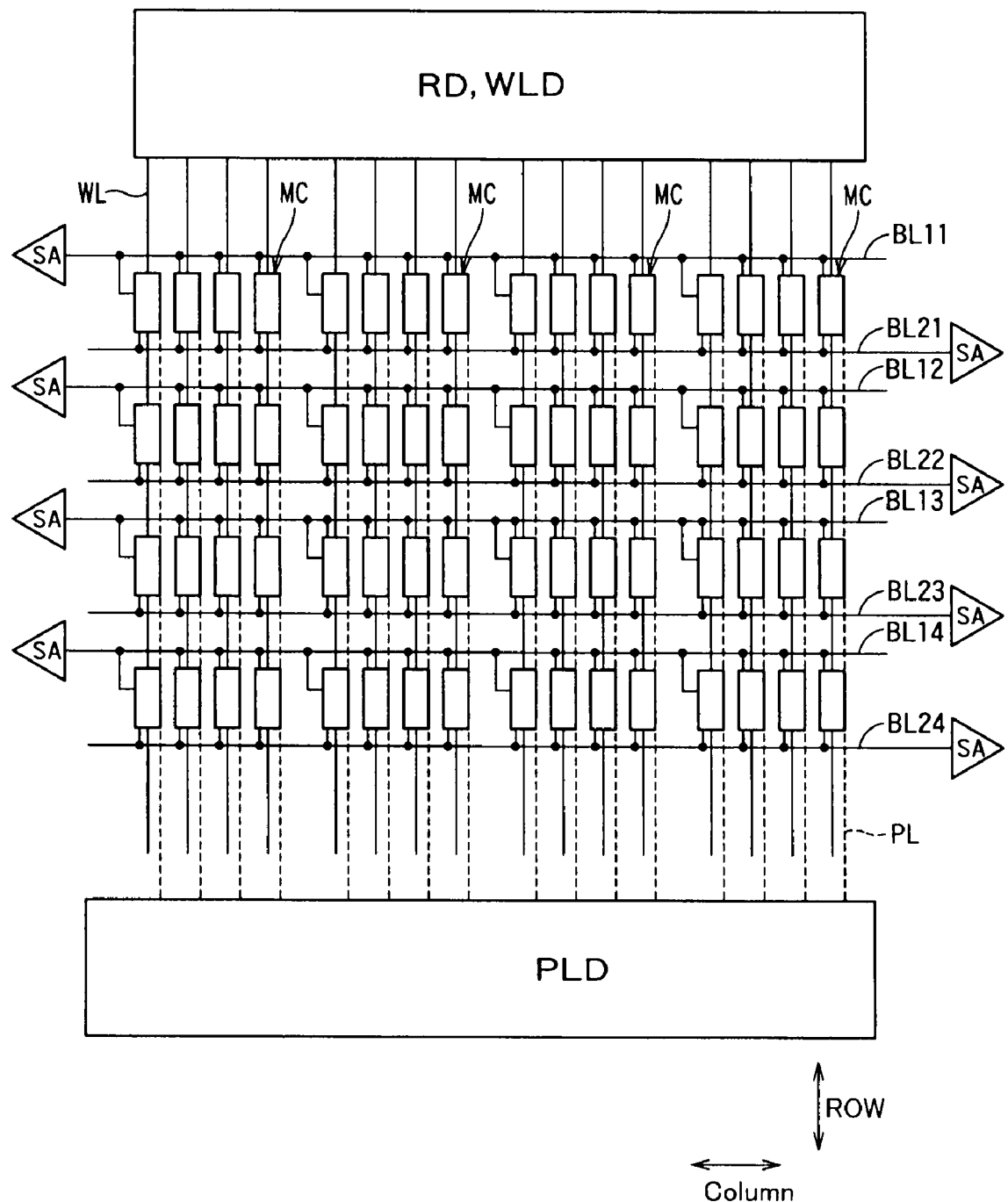
FIG. 7 is a block diagram of a ferroelectric memory according to a second embodiment of the present invention.

FIG. 7 shows the configuration of a ferroelectric memory according to a 2nd embodiment of this invention. In the 2nd embodiment, sense amplifiers SA are formed corresponding to each of a 1st bit line BL1$j$ and 2nd bit line BL2$j$. Therefore, a bit select line, a bit line select transistor, and a bit select line drive circuit become unnecessary. The configuration of the 2nd embodiment other than the above is the same as the configuration of the 1st embodiment.

A respective sense amplifier SA corresponding to a 2nd bit line BL2$j$ is formed in an opposite side of a respective sense amplifier SA corresponding to a 1st bit line BL1$j$ with the memory cell array interposed between those sense amplifiers. Thereby, the layout on the design of the sense amplifiers Sa becomes easier.

Figure 8:
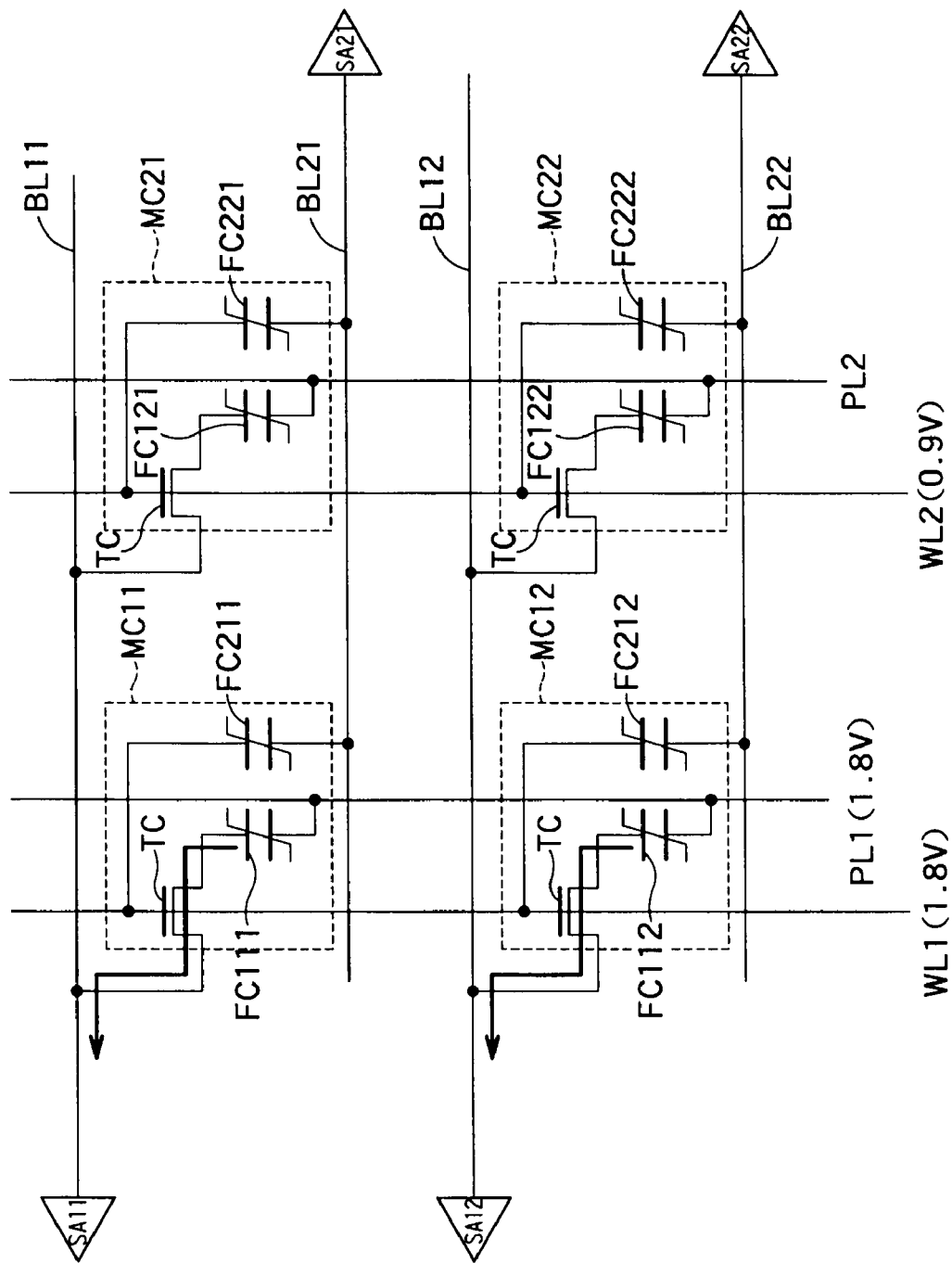
FIG. 8 is a circuit diagram showing a data detecting operation of a ferroelectric memory according to the 2nd embodiment.

FIG. 8 shows a detecting operation of the ferroelectric memory in the 2nd embodiment of the invention. FIG. 8 shows memory cells MC11-MC22 of 2×2 among memory cells MC shown in FIG. 7. In the 2nd embodiment, sense amplifiers SA11-SA22 detect data simultaneously from 1st ferroelectric memory FC211 and 2nd ferroelectric memory FC212 which are connected to selected word line WL1.

First, 1st bit lines BL1$j$ and 2nd bit lines BL2$j$ are preliminarily precharged at 0V or a middle potential (for example, 0.9V) of data "0" and data "1" before detection of a signal. In the data detecting operation, a potential of selected word line WL1 is set to the high potential VWLH (for example, 1.8V), and a potential of non-selected word line WL2 is set to the low level potential VWLL (for example, 0.9V). Thereby, 1st ferroelectric capacitors FC111 and FC112 in selected memory cells MC11 and MC12 are connected to 1st bit lines BL11 and BL12, respectively. Thereby, sense amplifiers SA21 and SA22 receive the data stored in 2nd ferroelectric capacitors FC211 and FC212, respectively, and detect the data.

Simultaneously with a drive of selected word line WL1, a potential of plate line PL1 is set to the high potential (for example, 1.8V). Thereby, data of 1st ferroelectric capacitors FC111 and FC112 is transmitted to 1st bit lines BL11 and BL12, respectively. Sense amplifiers SA11 and SA12 receive the data stored in 1st ferroelectric capacitors FC111 and FC112, respectively, and detect the data.

A potential of non-selected plate line PL2 may be floating, or may be set to an arbitrary potential. This is because memory cells MC21 and MC22 are not connected to 1st bit lines BL11 and BL12. To make control of a plate potential easier, the potential of plate line PL2 may be the same as the potential (for example, 1.8V) of plate line PL1.

A data write-in operation to memory cells MC is the same as that of 1st the embodiment.

According to the 2nd embodiment, data is simultaneously detected from 1st ferroelectric memories FC111 and FC121 and 2nd ferroelectric memories FC211 and FC212 in all memory cells MC11-MC22 to which sense amplifiers SA11-SA22 are connected to and that are connected to selected word line WL1. Thereby, a readout operation of the ferroelectric memory according to the 2nd embodiment can be twice as fast than a background memory. Furthermore, the 2nd embodiment has the same beneficial effects as the 1st embodiment.

Figure 9:
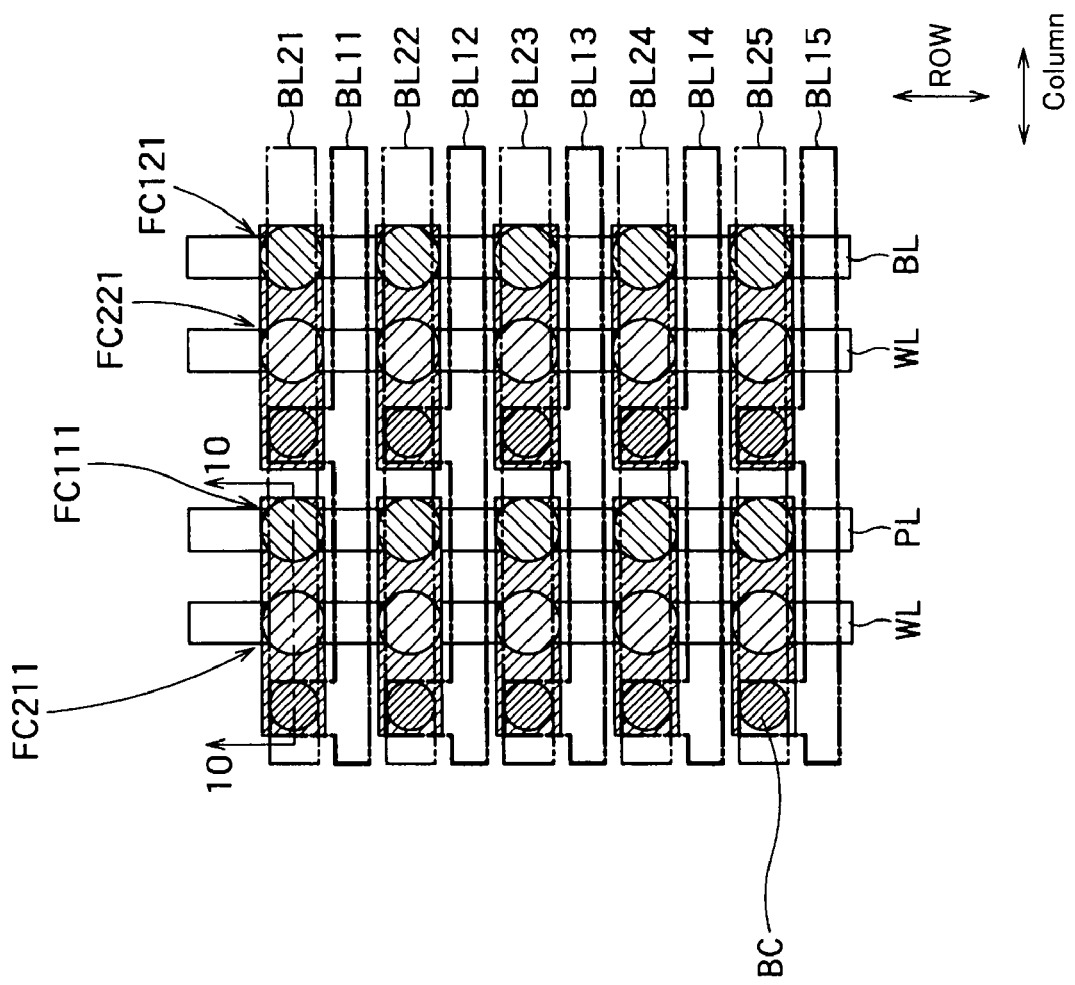
FIG. 9 is a plane view showing a rough layout of the ferroelectric memory in the 1st and 2nd embodiments.

FIG. 9 is a plane view showing a rough layout of the ferroelectric memory in the 1st and 2nd embodiments. 1st bit lines BL1*j* and 2nd bit lines BL2*j* are arranged in a column direction and are formed in a stripe shape alternately. Word lines WL and plate lines PL are arranged in a row direction and are formed in a stripe shape alternately. 1st ferroelectric capacitors FC1*ij* are formed in the intersection of plate lines PL and 1st bit lines BL1*j*. 2nd ferroelectric capacitors FC2*ij* are formed in the intersection of word lines WL and 1st bit lines BL1*j*.

A drain of each cell transistor is connected to a respective 1st bit line BL1*j* through a respective bit line contact BC.

Figure 10:
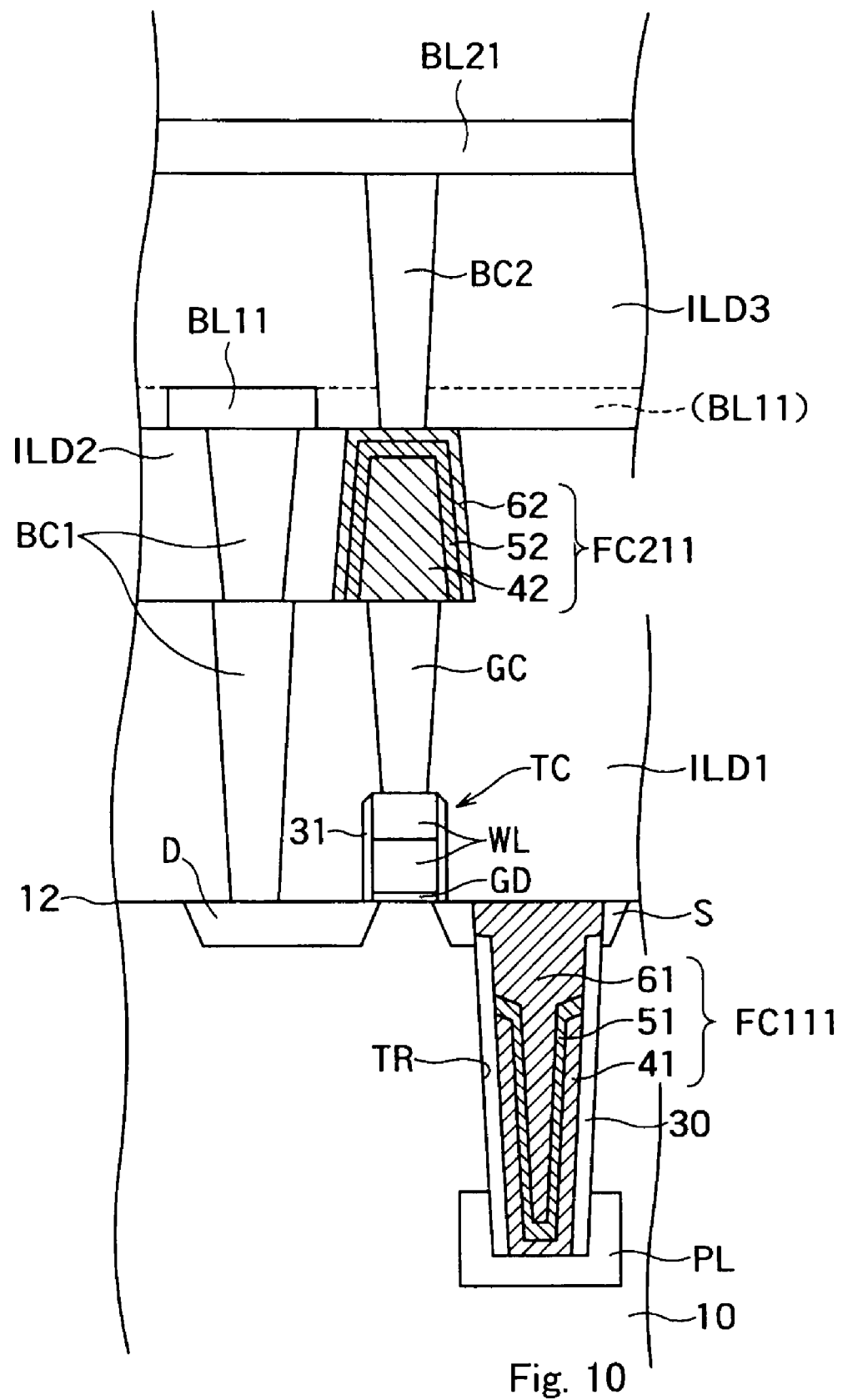
FIG. 10 is a cross-section diagram along line 10-10 of FIG. 9.

FIG. 10 is a cross-section diagram along line 10-10 of FIG. 9. A cross-section of one memory cell MC is shown in FIG. 10. 1st ferroelectric capacitor FC111 is a trench capacitor, and 2nd ferroelectric capacitor FC211 is a stacked capacitor. Plate line PL is buried in silicon substrate 10. 1st ferroelectric capacitor FC111 is formed as a trench capacitor on plate line PL.

1st ferroelectric capacitor FC111 includes lower electrode 41, ferroelectric layer 51, and upper electrode 61. Lower electrode 41 is connected to plate line PL. 1st ferroelectric capacitor FC111 is insulated from silicon substrate 10 by sidewall 30 formed in a side of a trench. Ferroelectric layer 51 is formed between lower electrode 41 and upper electrode 61. Upper electrode 61 is connected to source layer S of cell transistor TC.

Cell transistor TC is formed on the surface of silicon substrate 10. Cell transistor TC includes word line WL formed through gate insulating film GD on a channel region between source layer S and drain layer D. Word line WL functions as a gate electrode of cell transistor TC.

Word line WL is connected to lower electrode 42 of 2nd ferroelectric capacitor FC211 through gate contact GC. 2nd ferroelectric capacitor FC211 is formed on gate contact GC. 2nd ferroelectric capacitor FC211 includes lower electrode 42, ferroelectric layer 52, and upper electrode 62. Lower electrode 42 is connected to word line WL through gate contact GC. Ferroelectric layer 52 is formed between lower electrode 42 and upper electrode 62. Upper electrode 62 is connected to 2nd bit line BL21 through bit line contact BC2.

Drain layer D of cell transistor TC is connected to 1st bit line BL11 through bit line contact BC1. Bit line BL11 has a convex part which connects between bit line contacts BC1 to 1st bit line BL11, as shown in a dashed line of FIG. 10, and FIG. 9.

Interlayer insulating film ILD insulates between word line WL and bit line contact BC1, and between 2nd ferroelectric capacitor FC211 and bit line contacts BC1 (1st bit line BL11).

1st ferroelectric capacitor FC111 is a trench capacitor, and 2nd ferroelectric capacitor FC211 is a stacked capacitor. Thereby, a unit area of each memory cell MC can be made smaller, and this embodiment is suitable for miniaturization of a memory chip. Therefore, this embodiment can store high-capacity data in a small memory chip.

FIGS. 11 to 14 are a plane view showing a method for manufacturing a ferroelectric memory shown in FIGS. 9 and 10.

First, plate line PL is buried in silicon substrate 10. Plate line PL can be formed in a silicon bulk substrate using a damascene process. A material of plate line PL can be high melting point metals, such as doped polysilicon, molybdenum, tungsten, aluminum, and copper. Thereby, a plane pattern shown in FIG. 11 is formed.

Next, after covering an upper surface of plate line PL with an insulating film, silicon is formed on a bulk substrate by, for example, an epitaxial growth. Thereby, silicon substrate 10 including plate line PL is formed. Usually, since a width of plate line PL is narrow, an epitaxial silicon layer grows also above plate line PL. Thereby, silicon substrate 10 and plate line PL shown in FIG. 10 are formed.

Next, 1st ferroelectric capacitor FC111 is formed. Trench TR which reaches plate line PL from surface 12 of silicon substrate 10 shown in FIG. 10 is formed. Sidewall 30 is formed on an inner wall of Trench TR. Sidewall 30 can be a silicon oxide, a silicon nitride film, an aluminum oxide film (aluminum $Al_2O_3$), or a hafnium oxide film ($HfO_2$).

A resist is then filled up in trench TR. The upper part of the resist is removed. At this time, the upper surface of the resist is located in a position (a shallow position) higher than a depth of a diffusion layer of source layer S. The upper part of sidewall 30 is removed by using the resist as a mask. After removing the resist in trench 52, the insulating film in a bottom of trench 52 is removed by, for example, anisotropic etching. Thereby, plate line PL is exposed in the bottom of trench TR.

Next, a material of lower electrode 41 is deposited in trench TR. The material of lower electrode 41 can be a material including iridium (Ir), oxide iridium (IrO2), ruthenium (Ru), ruthenium oxide (RuO2), or platinum (Pt). Etching back of an upper part of lower electrode 41 is carried out using the method which removed the upper part of sidewall 30. The etching back of lower electrode 56 is performed until the upper part of sidewall 30 is exposed. Since plate line PL is exposed in the bottom of trench TR, lower electrode 41 contacts plate line PL.

Next, ferroelectric film 51 is deposited on lower electrode 41. A material of ferroelectric film 51 can be a metal oxide of perovskite structure such as a lead zirconate titanate (PZT), or a strontium bismuth tantalate (SBT). Etching back of the upper part of ferroelectric film 51 also is carried out as for the lower electrode 41. However, ferroelectric film 51 covers lower electrode 41, and lower electrode 41 is not exposed.

Figure 12:
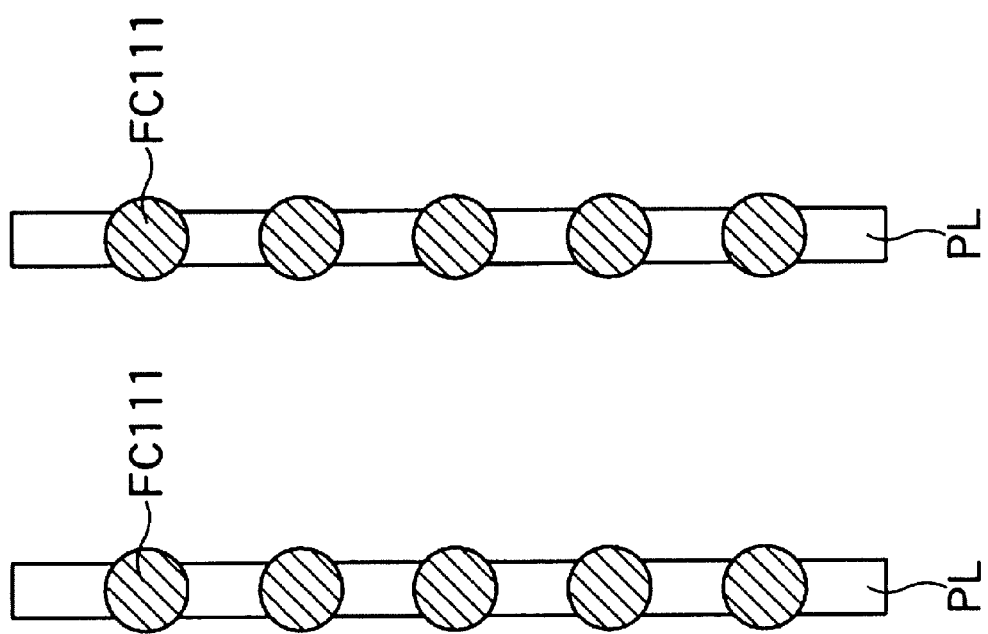
FIG. 12 is a plane view showing a method for manufacturing the ferroelectric memory according to the 1st embodiment.

Next, a material of upper electrode 61 is deposited so that a remaining internal space of trench RT is filled up. Upper electrode 61 contacts silicon substrate 10 forming source layer S in the upper part of trench TR. The material of upper electrode 61 can be Ir, IrO2, Ru, RuO2, Pt, etc. Thus, 1st ferroelectric capacitor FC111 of a trench type is formed. The plane pattern at this time is shown in FIG. 12.

Next, cell transistor TC is formed. Gate insulating film GD shown in FIG. 10 is formed on the channel region of cell transistor TC. A material of gate insulating film GD can be a silicon oxide, a silicon nitride film, a silicon oxy nitride film, or high dielectric constant insulating films (a hafnium oxide film, tantalic oxy film, etc.) that have a dielectric constant higher than a silicon oxide.

A material of word line WL is deposited on gate insulating film GD, for example, a doped polysilicon. The material of word line WL is processed into a pattern of word line WL by using, for example, lithography and a RIE method. Sidewall 31 is formed in the side of word line WL.

An impurity ion is implanted in source layer S and drain layer D by using word line WL as a mask. Then, source layer S and drain layer D are formed by heat treatment. Source layer S is connected to upper electrode 61 of 1st ferroelectric capacitor FC111.

Next, silicide is formed in the upper part of word line WL. The silicide material can be NiSi, CoSi, TiSi, or WSi.

Figure 13:
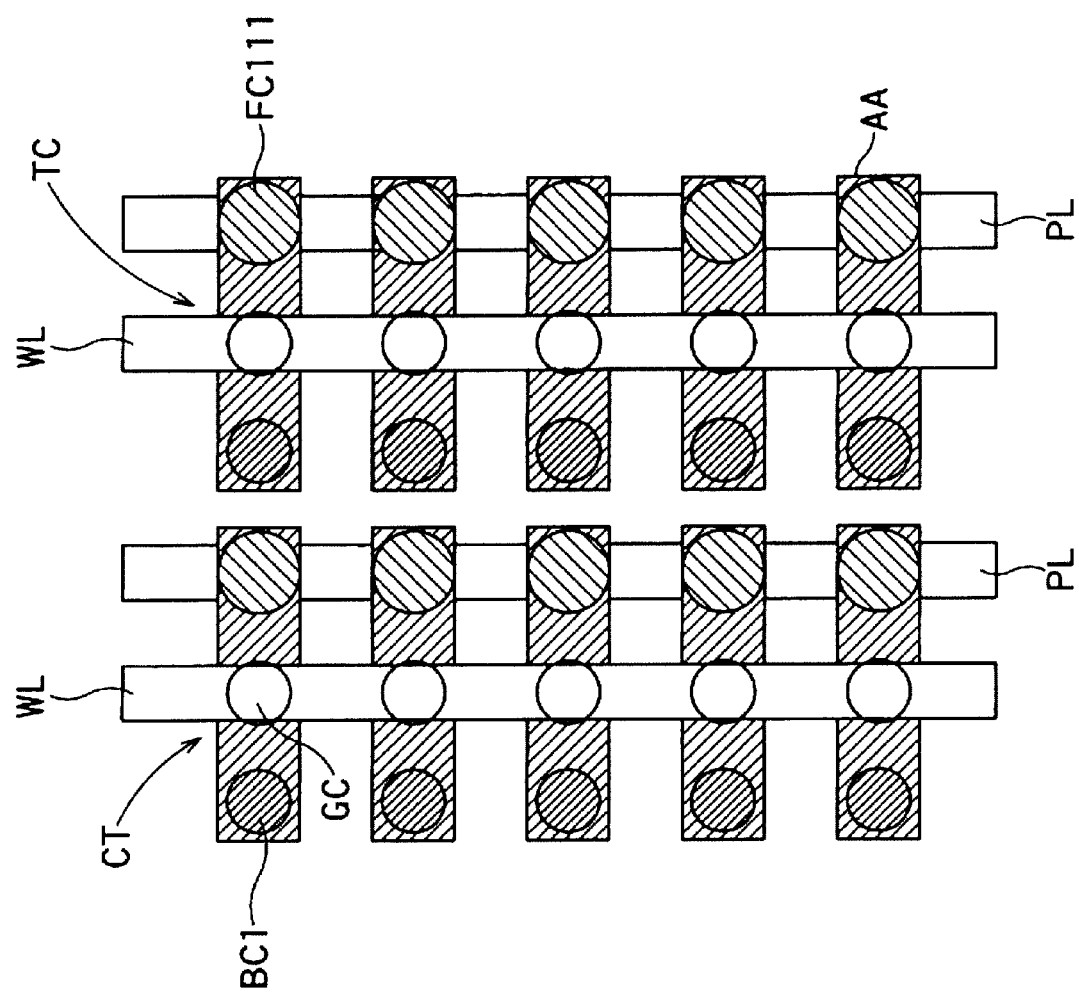
FIG. 13 is a plane view showing a method for manufacturing the ferroelectric memory according to the 1st embodiment.

Next, after depositing 1st interlayer insulating film ILD1, a contact hole for bit line contact BC1 and gate contact GC is formed using, for example, lithography and RIE method. By filling up the contact hole with a conductive material, bit line contact BC1 and gate contact GC are formed. A material of bit line contact BC1 and gate contact GC can be, for example, tungsten, aluminum, copper, titanium, a titanium nitride film, tantalum, a tantalum nitride film, niobium, a niobium nitride film, or an aluminum oxide. The plane pattern at this time is shown in FIG. 13.

Next, 2nd ferroelectric capacitor FC211 of a stacked type is formed on gate contact GC. Lower electrode 42 is formed using, for example, lithography and RIE method. A material of lower electrode 42 can be any of the materials of lower electrode 41 described above. Ferroelectric film 52 and upper electrode 62 are deposited on lower electrode 42. A material of ferroelectric film 52 and upper electrode 62 can be any of the materials of ferroelectric film 51 and upper electrode 61 described above. Using lithography and RIE method, for example, ferroelectric film 52 and upper electrode 62 on the upper surface and the side of lower electrode 41, and other ferroelectric film 52 and other upper electrode 62, are removed. Thereby, 2nd ferroelectric capacitor FC211 is completed.

Next, 2nd interlayer insulating film ILD2 is deposited on 2nd ferroelectric capacitor FC211. Using CMP, for example, 2nd interlayer insulating film ILD2 is polished until upper electrode 62 is exposed. Bit line contact BC1 is formed in 2nd interlayer insulating film ILD. Since a material and a manufacturing method of bit line contact BC1 are the same as the above, that explanation is omitted here.

Figure 14:
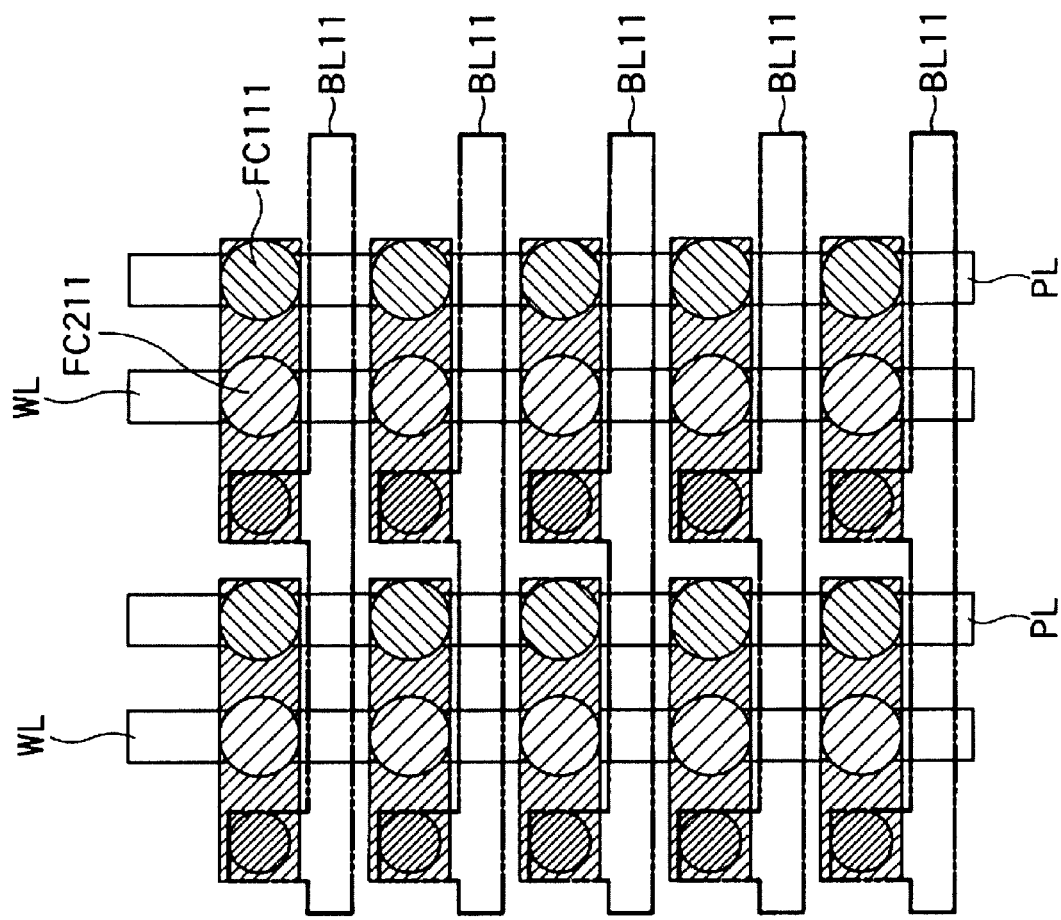
FIG. 14 is a plane view showing a method for manufacturing the ferroelectric memory according to the 1st embodiment.

Next, to form 1st bit line BL11, a 1st metal layer is deposited. Patterning of the 1st metal layer is carried out using, for example, lithography and etching, and 1st bit line BL11 is formed. The plane pattern at this time is shown in FIG. 14. 1st bit line BL11 has a convex part so that it connects to bit line contact BC1.

Next, 3rd interlayer insulating film ILD3 is deposited on 1st bit line BL11 and 2nd bit line BL2. Bit line contact BC2 which extends to upper electrode 62 is formed in 3rd interlayer insulating film ILD3. Since a material and a manufacturing method of bit line contact BC2 are the same as those of the above bit line contact BC1, that explanation is omitted here.

Furthermore, to form 2nd bit line BL21 shown in FIG. 10, a 2nd metal layer is deposited. Patterning of the 2nd metal layer is carried out using, for example, lithography and etching, and 2nd bit line BL21 is formed.

Thus, the ferroelectric memory by this embodiment is completed.

Figure 17:
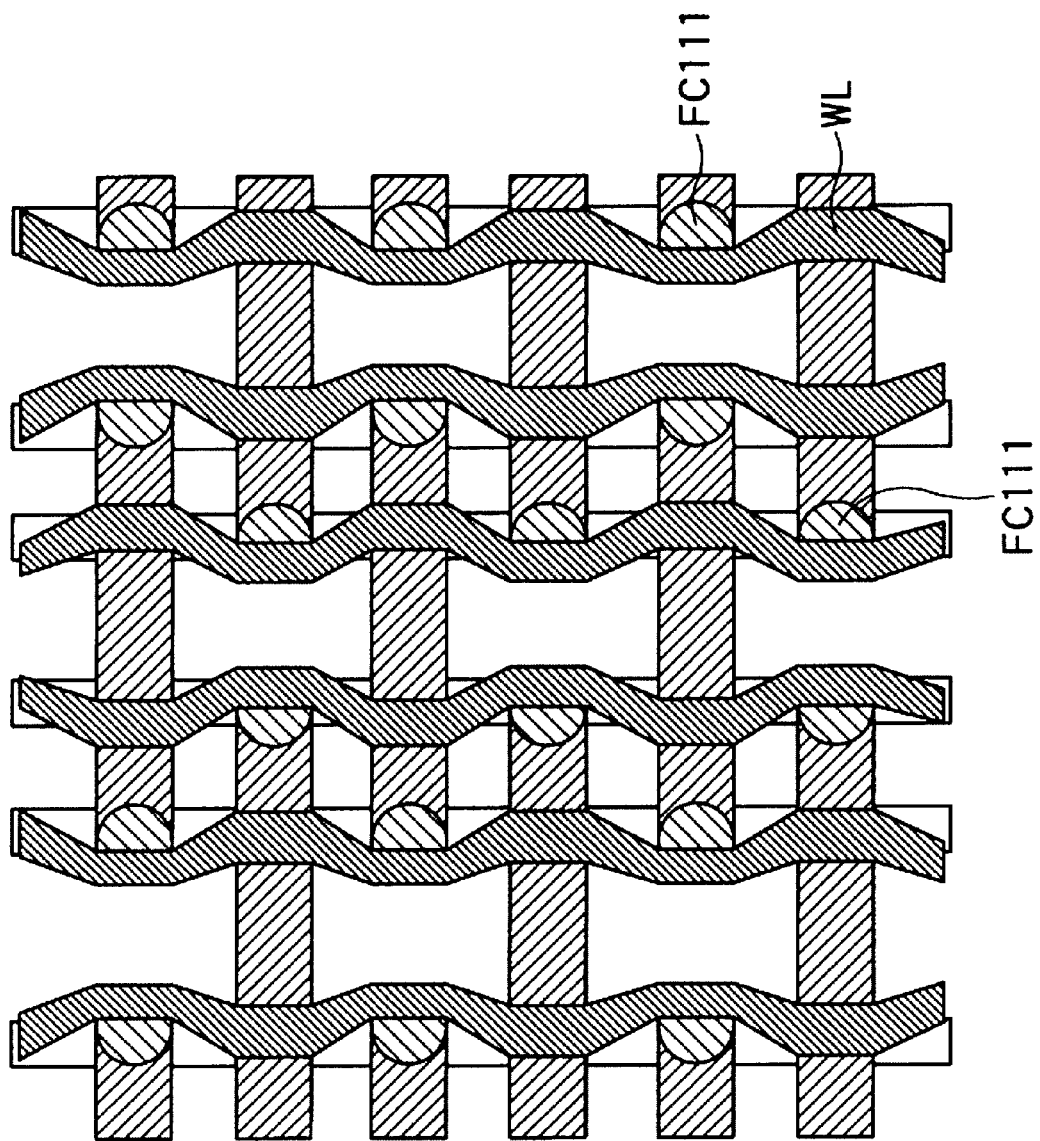
FIG. 17 is a plane view showing a method for manufacturing the ferroelectric memory according to the 3rd embodiment.
Figure 18:
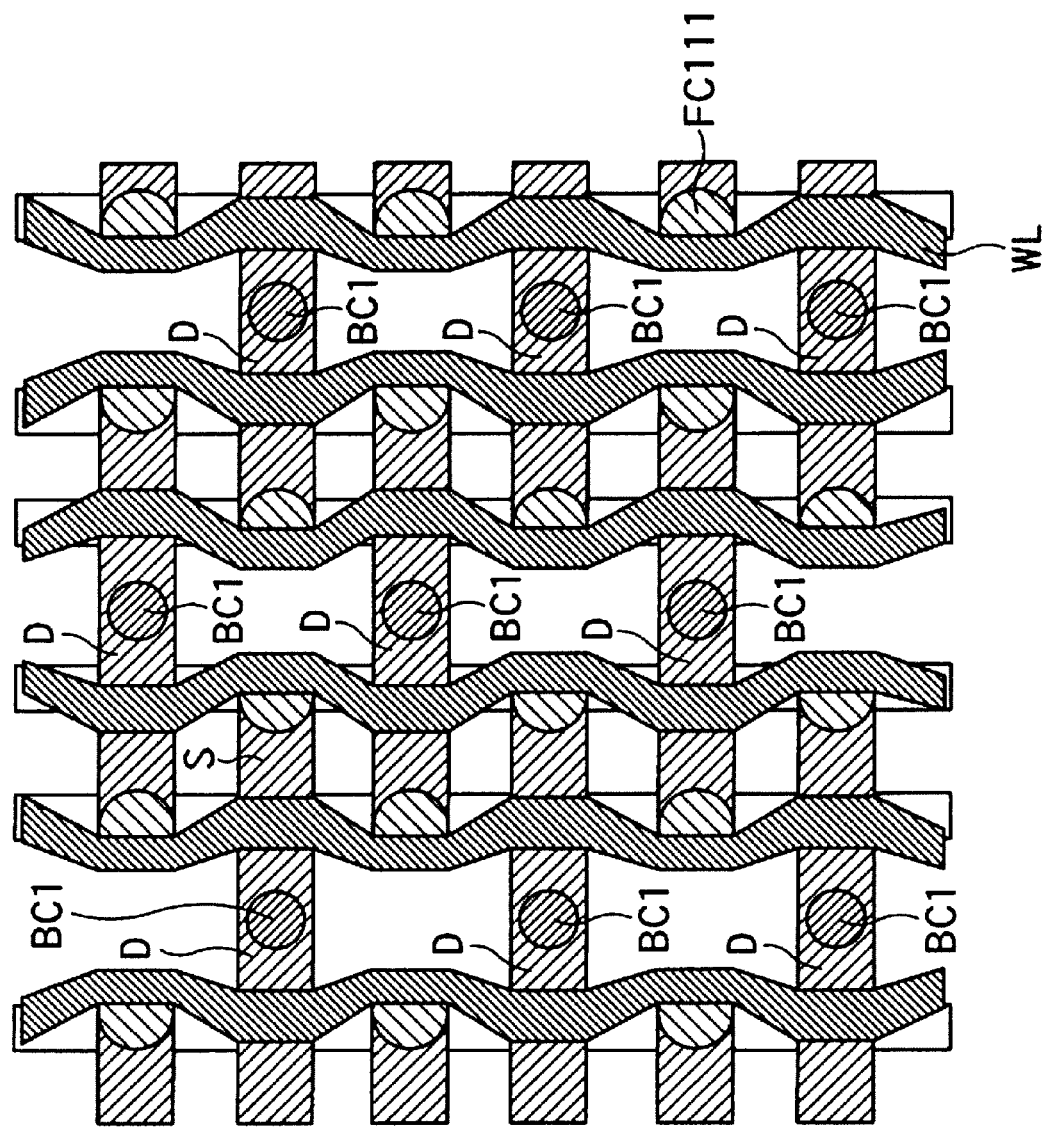
FIG. 18 is a plane view showing a method for manufacturing the ferroelectric memory according to the 3rd embodiment.
Figure 19:
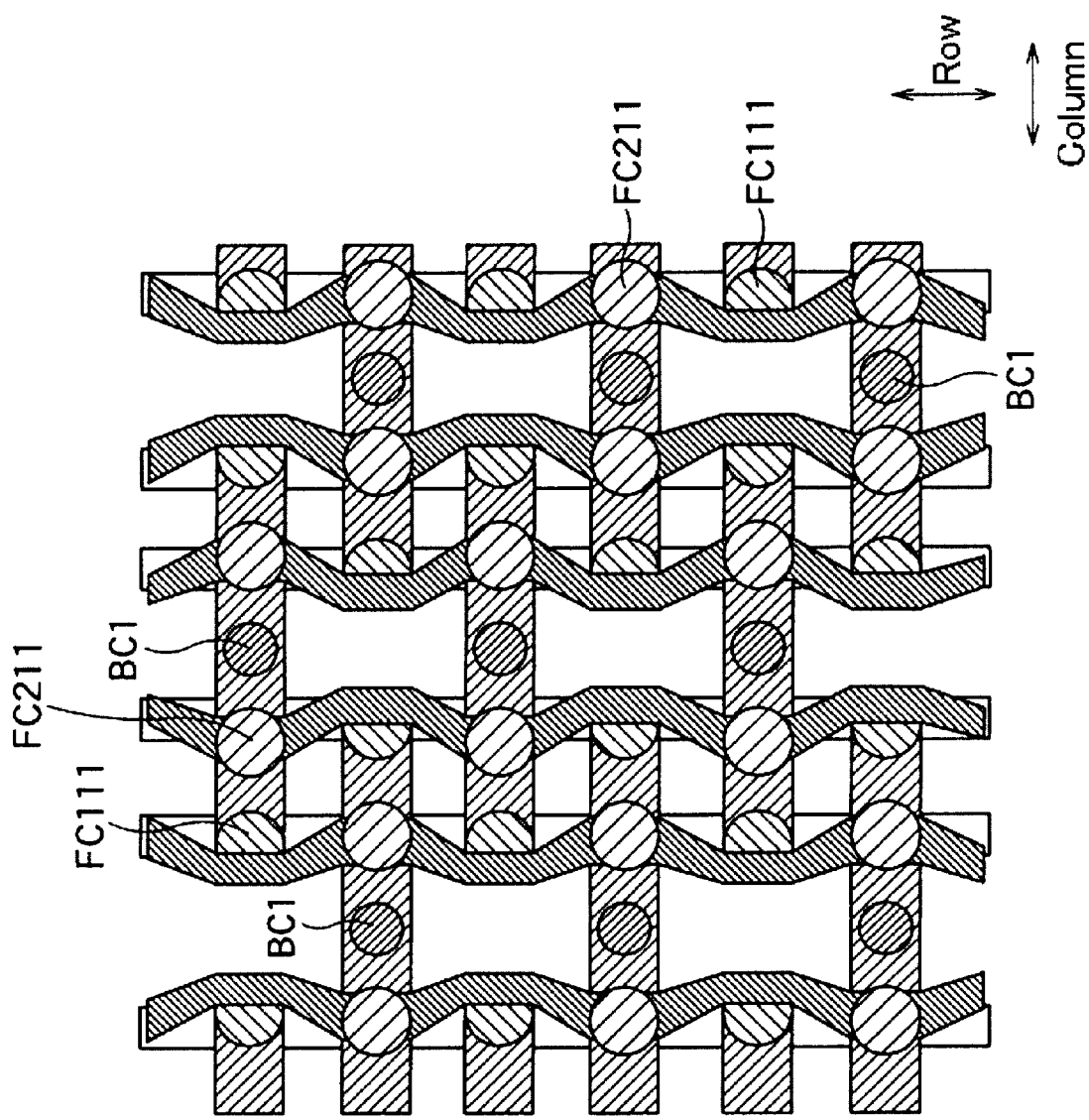
FIG. 19 is a plane view showing a method for manufacturing the ferroelectric memory according to the 3rd embodiment.

A manufacturing method of the ferroelectric memory by a 3rd embodiment of the invention is shown in FIGS. 15 to 21. The layout in the 3rd embodiment is different from that in the 1st embodiment. However, the manufacturing method of the ferroelectric memory by the 3rd embodiment is the same as that of 1st embodiment. In the 3rd embodiment, 1st ferroelectric capacitor FC1 and 2nd ferroelectric capacitor FC2 are arranged in a straight line in a row direction and a column direction alternately as shown in FIG. 19.

Figure 15:
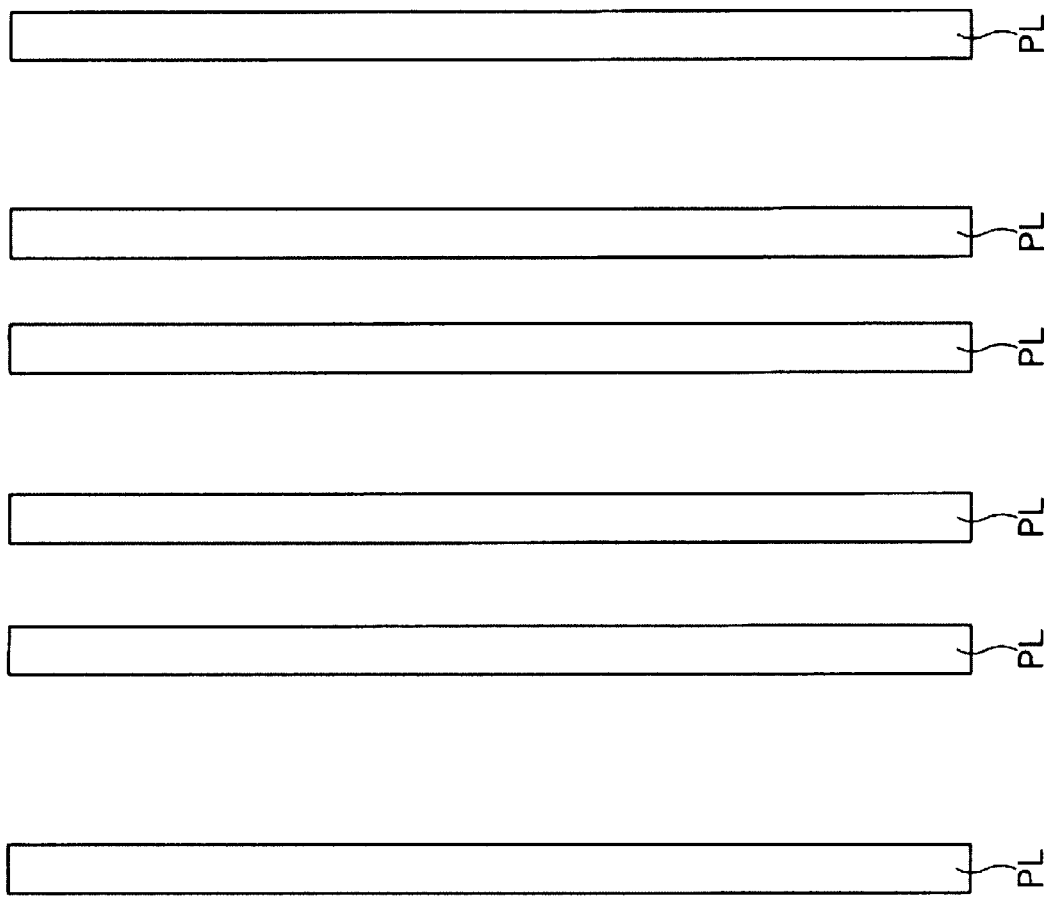
FIG. 15 is a plane view showing a method for manufacturing the ferroelectric memory according to a 3rd embodiment of the invention.
Figure 16:
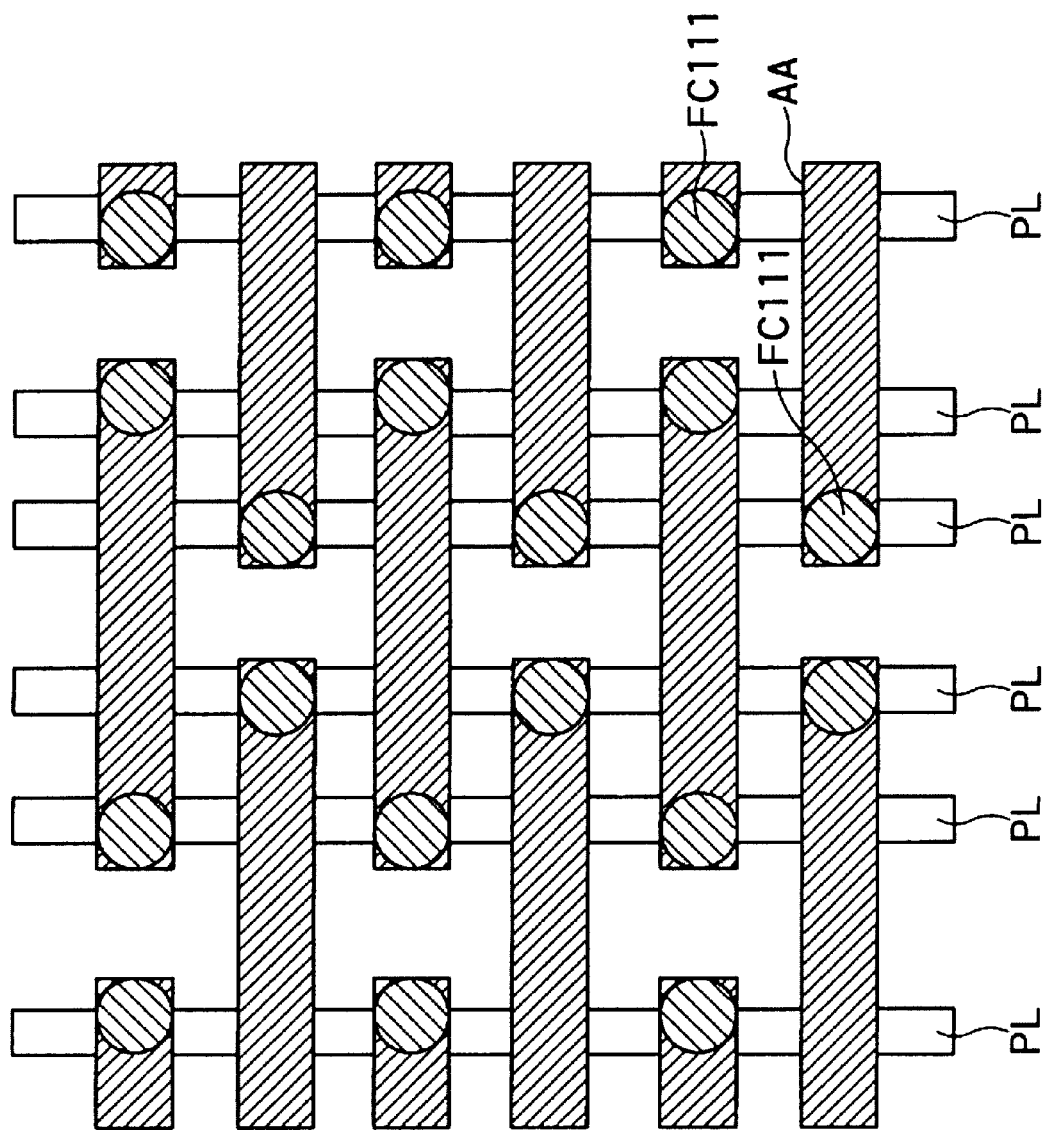
FIG. 16 is a plane view showing a method for manufacturing the ferroelectric memory according to the 3rd embodiment.

First, as shown in FIG. 15, plate lines PL are formed. Plate lines PL are formed in silicon substrate 10. Next, as shown in FIG. 16, 1st ferroelectric capacitors FC111 are formed on plate lines PL. 1st ferroelectric capacitors FC111 are trench capacitors, and are formed in the same process as the 1st manufacturing method. Next, as shown in FIG. 17, word lines WL (gate electrode) are formed. To prevent a short circuit between a respective bit line contact BC1 and 2nd ferroelectric capacitor FC2, word lines WL are formed in zigzags.

Next, source layer S and drain layer D are formed using word lines WL as a mask. As shown in FIG. 18, bit line contacts BC1 are formed on drain layer D.

Next, as shown in FIG. 19, when seen from the upper part of substrate 10, in a column direction of a column, 2nd ferroelectric capacitors FC211 are arranged between bit line contacts BC1 and 2nd ferroelectric capacitors FC111, and in a row direction, and 2nd ferroelectric capacitors FC211 are arranged between neighboring 2nd ferroelectric capacitors FC111. 2nd ferroelectric capacitors FC211 are formed as stacked type capacitors as in the 1st manufacturing method.

Figure 20:
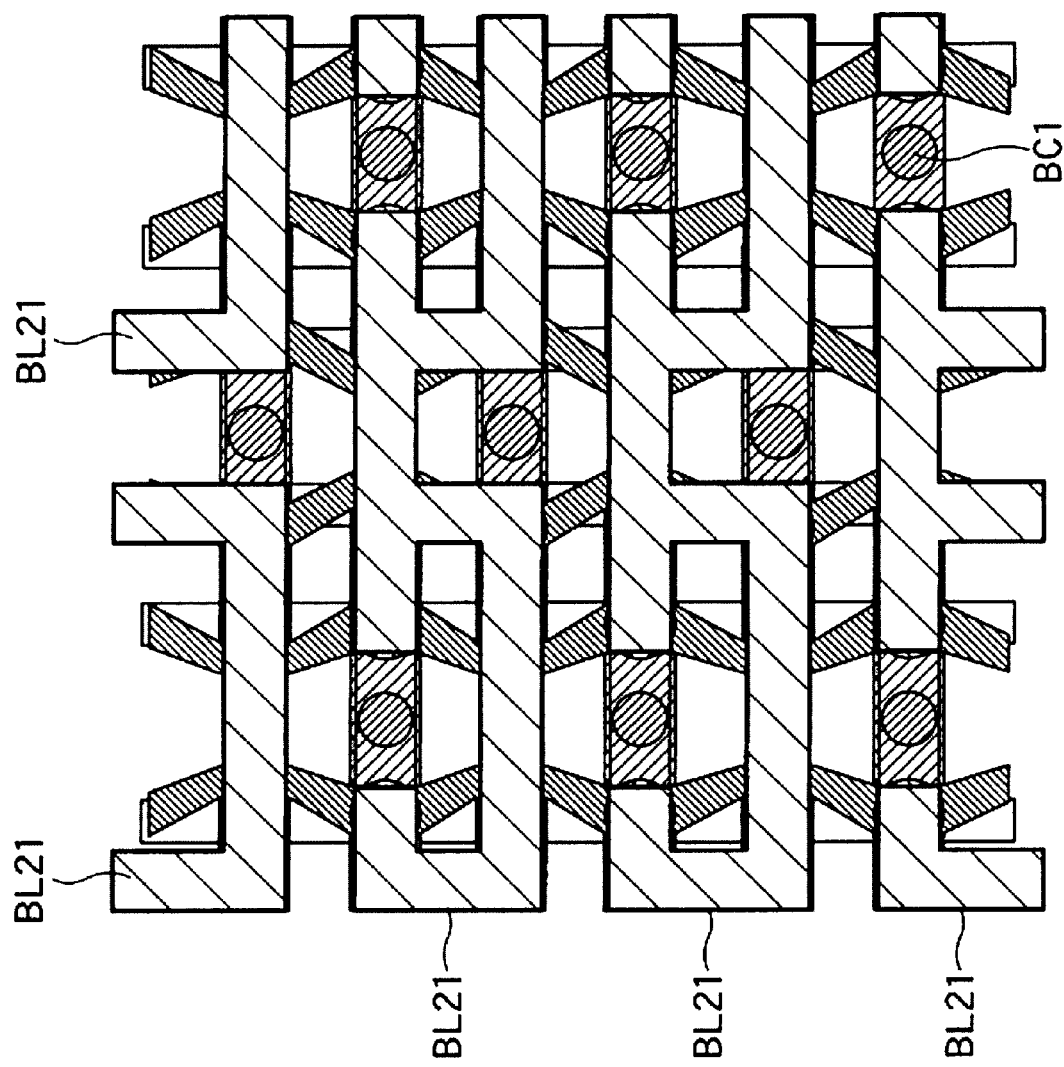
FIG. 20 is a plane view showing a method for manufacturing the ferroelectric memory according to the 3rd embodiment.

Next, as shown in FIG. 20, 2nd bit lines BL21 are formed. 2nd bit lines BL21 connect to 2nd ferroelectric capacitors FC211 arranged in two columns and neighbored in a row direction. In addition, 2nd bit lines BL21 are insulated from 1st ferroelectric capacitors FC111, 2nd ferroelectric capacitors FC211, and word lines WL by an interlayer insulating film as in the 1st embodiment.

Figure 21:
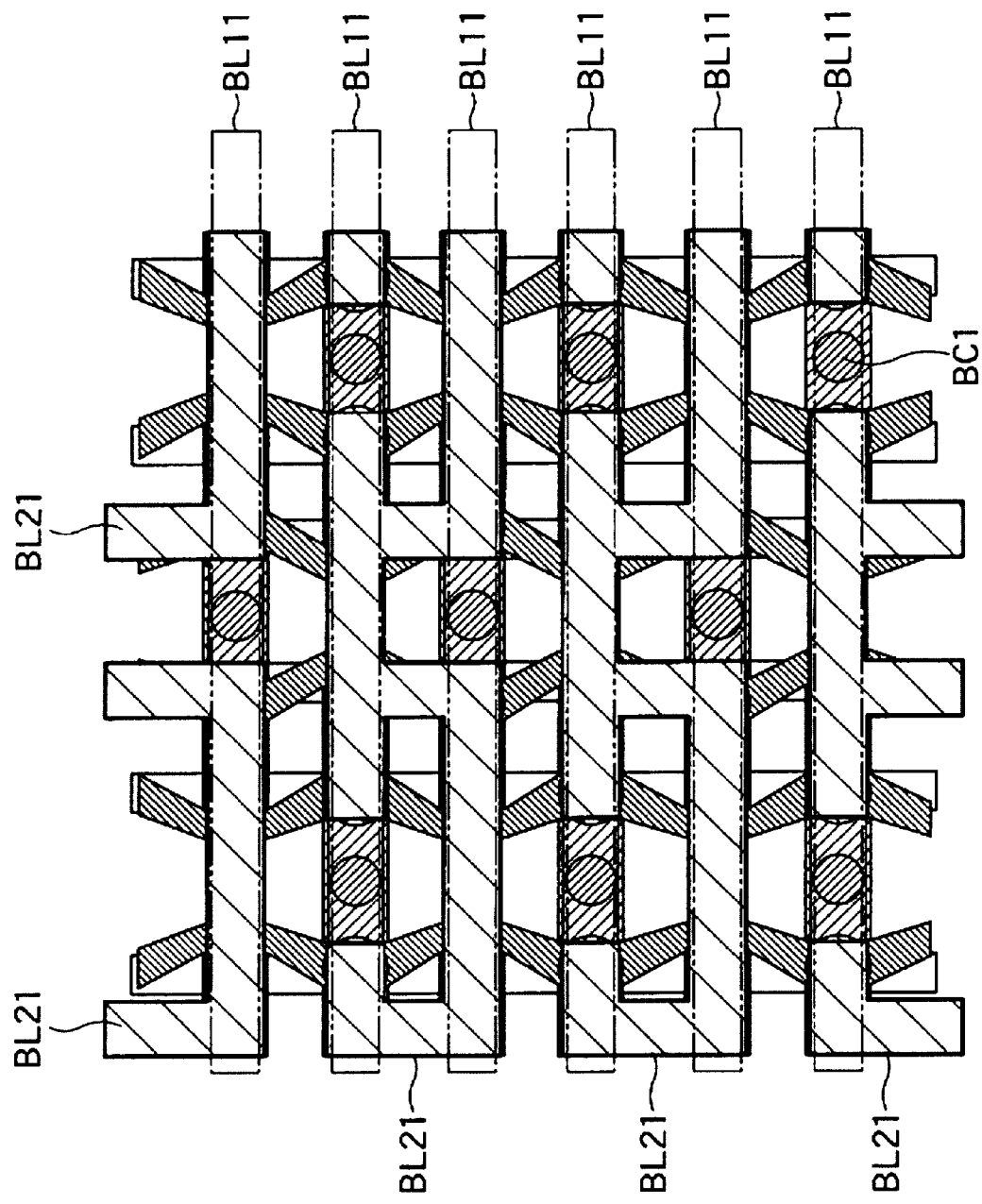
FIG. 21 is a plane view showing a method for manufacturing the ferroelectric memory according to the 3rd embodiment.

Next, as shown in FIG. 21, 1st bit lines BL11 are formed. 1st bit lines BL11 are connected to bit line contacts BC1. In addition, 1st bit lines BL11 are insulated from 1st ferroelectric capacitors FC111, 2nd ferroelectric capacitors FC211, word lines WL, and 2nd bit lines BL21 by an interlayer insulating film as in 1st embodiment.

Even if this embodiment has the above layout, this embodiment has the same effect as the 1st embodiment.

While the invention is subject to various modifications and alternative forms, specific embodiments thereof are shown by way of embodiments in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

What is claimed is:

1. A semiconductor memory device comprising:
   a plurality of word lines;
   a plurality of first bit lines;
   a plurality of plate lines formed corresponding to the word lines;
   a plurality of second bit lines formed corresponding to the first bit lines;
   a plurality of first ferroelectric capacitors each including a ferroelectric film between two electrodes;
   a plurality of cell transistors formed corresponding to the first ferroelectric capacitors, and each including a gate coupled to a respective of the word lines;
   a plurality of second ferroelectric capacitors each including a ferroelectric film between two electrodes; and
   a sense amplifier configured to detect data stored in a selected one of the first ferroelectric capacitors through a respective of the first bit lines or data stored in selected one of the second ferroelectric capacitors through a respective of the second bit lines, or to write data into the selected one of the first ferroelectric capacitors or the selected one of the second ferroelectric capacitors;
   wherein the first ferroelectric capacitors and the respective cell transistors connect between the respective first bit lines and the respective plate lines in series, and the second ferroelectric capacitors connect between the respective second bit lines and the respective word lines.

2. The semiconductor memory device according to claim 1, wherein:
   a potential of the respective second bit line is a middle potential between a potential of the selected word line and a potential of the non-selected word line when data is read out from the first ferroelectric capacitor or is written into the selected first ferroelectric capacitor, and
   a potential of the non-selected word line is a middle potential between a potential of the respective second bit line transmitting a first logic data and a potential of the respective second bit line transmitting a second logic data when data is read out from the selected second ferroelectric capacitor or written into the selected second ferroelectric capacitor.

3. The semiconductor memory device according to claim 2, wherein data stored in the selected first ferroelectric capacitor and the selected second ferroelectric capacitor are read out simultaneously.

4. The semiconductor memory device according to claim 1, wherein:
the sense amplifier writes data in the plurality of first ferroelectric capacitors connected to the selected word line simultaneously when data is written into the selected first ferroelectric capacitor, and
the sense amplifier writes data into the plurality of second ferroelectric capacitors connected to the selected word line in series when data is written into the selected second ferroelectric capacitor.

5. The semiconductor memory device according to claim 1, wherein:
each first ferroelectric capacitor comprises a trench capacitor formed in a trench formed in a substrate, and
each second ferroelectric capacitor comprises a stacked capacitor formed over the substrate.

6. The semiconductor memory device according to claim 1, further comprising:
a first bit transistor connected between a first bit select line and the sense amplifier, a gate of the first bit line select transistor connected to a first bit select line, and
a second bit transistor connected between a second bit select line and the sense amplifier, a gate of the second bit line select transistor connected to a second bit select line.

7. The semiconductor memory device according to claim 1, wherein:
the sense amplifier includes a first sense amplifier and a second sense amplifier,
the first sense amplifier connects to the respective first bit line, and
the second sense amplifier connects to the respective second bit line.

8. The semiconductor memory device according to claim 1, wherein:
the respective first bit line and the respective second bit line are arranged in a row direction alternately,
the respective word line and the respective plate line are arranged in a column direction alternately,
each first ferroelectric capacitor is formed in an intersection of the respective plate line and the respective second bit line, and
each second ferroelectric capacitor is formed in an intersection of the respective word line and the respective second bit line.

9. The semiconductor memory device according to claim 1, wherein the cell transistors are formed on the substrate and in a layer between the first ferroelectric capacitors and the second ferroelectric capacitors.

10. The semiconductor memory device according to claim 1, wherein the first ferroelectric capacitors and the second ferroelectric capacitors are arranged in a row direction and a column direction alternately.

11. The semiconductor memory device according to claim 10, wherein the word lines are formed in a manner in a column direction.

* * * * *